(12) United States Patent
Manack et al.

(10) Patent No.: US 12,100,678 B2
(45) Date of Patent: Sep. 24, 2024

(54) CONDUCTIVE MEMBERS FOR DIE ATTACH IN FLIP CHIP PACKAGES

(71) Applicant: TEXAS INSTRUMENTS INCORPORATED, Dallas, TX (US)

(72) Inventors: Christopher Daniel Manack, Flower Mound, TX (US); Salvatore Frank Pavone, Murphy, TX (US); Maricel Fabia Escaño, Angeles (PH); Rafael Jose Lizares Guevara, Metro Manila (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/669,070

(22) Filed: Oct. 30, 2019

(65) Prior Publication Data

US 2021/0134750 A1    May 6, 2021

(51) Int. Cl.
*H01L 23/00* (2006.01)
(52) U.S. Cl.
CPC .............. *H01L 24/13* (2013.01); *H01L 24/81* (2013.01); *H01L 24/94* (2013.01); *H01L 2224/0401* (2013.01); *H01L 2224/13082* (2013.01); *H01L 2224/13147* (2013.01); *H01L 2224/13582* (2013.01); *H01L 2224/81815* (2013.01)

(58) Field of Classification Search
CPC ......... H01L 24/13; H01L 24/94; H01L 24/81; H01L 2224/81815; H01L 2224/13082; H01L 2224/13582; H01L 2224/0401; H01L 2224/13147
See application file for complete search history.

(56) References Cited

U.S. PATENT DOCUMENTS

| | | | |
|---|---|---|---|
| 6,518,089 B2 | 2/2003 | Coyle | |
| 6,853,076 B2* | 2/2005 | Datta | H01L 24/13 257/E23.021 |
| 6,867,072 B1 | 3/2005 | Shiu et al. | |
| 2002/0033412 A1* | 3/2002 | Tung | H01L 24/12 257/E23.021 |
| 2006/0214308 A1 | 9/2006 | Yu et al. | |

(Continued)

OTHER PUBLICATIONS

Amagai et al., "Ball Grid Array Packages with the Copper Core Solder Balls," New Package Development (NPD) Dept., Texas Instruments, Japan, vol. 3, No. 3, (2000), pp. 249-255 [Online] www.jstage.jst.go.jp/aticle/jiep1998/3/3/3_3_249/_pdf.

(Continued)

*Primary Examiner* — David Vu
(74) *Attorney, Agent, or Firm* — Yudong Kim; Frank D. Cimino

(57) ABSTRACT

In examples, a semiconductor package comprises a semiconductor die having an active surface; a conductive layer coupled to the active surface; and a polyimide layer coupled to the conductive layer. The package also comprises a conductive pillar coupled to the conductive layer and to the polyimide layer; a flux adhesive material coupled to the conductive pillar; and a solder layer coupled to the flux adhesive material. The package further includes a conductive terminal coupled to the solder layer and exposed to a surface of the package, the active surface of the semiconductor die facing the conductive terminal.

33 Claims, 20 Drawing Sheets

(56) References Cited

U.S. PATENT DOCUMENTS

| | | | |
|---|---|---|---|
| 2009/0014896 A1* | 1/2009 | Hsu | H01L 24/81 |
| | | | 257/778 |
| 2010/0193936 A1* | 8/2010 | Tanie | H01L 23/49816 |
| | | | 257/693 |
| 2011/0233761 A1* | 9/2011 | Hwang | H01L 24/16 |
| | | | 257/E23.079 |
| 2011/0248398 A1 | 10/2011 | Parvarandeh et al. | |
| 2016/0300808 A1* | 10/2016 | Kuo | H01L 25/50 |
| 2019/0013284 A1* | 1/2019 | Fang | H01L 23/055 |

OTHER PUBLICATIONS

Jiangyin Changdian Advanced Packaging Co., Ltd., "jcap Company Presentation," Jan. 2015, 30 p. [Online] www.connectec-japan.com/img/file.pdf.

* cited by examiner

CONDUCTIVE MEMBERS FOR DIE ATTACH IN FLIP CHIP PACKAGES

BACKGROUND

Flip-chip packages (e.g., from a leadframe) include dies that are flipped and attached to conductive terminals of the packages using conductive members (e.g., solder balls). The conductive members are electrically and mechanically coupled to active areas of the dies through metal redistribution layers, polyimide layers, passivation layers, die pads, etc.

SUMMARY

In examples, a semiconductor package comprises a semiconductor die having an active surface; a conductive layer coupled to the active surface; and a polyimide layer coupled to the conductive layer. The package also comprises a conductive pillar coupled to the conductive layer and to the polyimide layer; a flux adhesive material coupled to the conductive pillar; and a solder layer coupled to the flux adhesive material. The package also includes a conductive terminal coupled to the solder layer and exposed to a surface of the package, the active surface of the semiconductor die facing the conductive terminal.

In examples, a method of manufacturing a semiconductor package comprises providing a semiconductor wafer having an active surface; forming a conductive layer above the active surface; and positioning a polyimide layer abutting the conductive layer. The method also comprises forming a conductive pillar above the conductive layer and abutting the polyimide layer; applying a flux adhesive material to a surface of the conductive pillar opposite the active surface; and positioning a conductive member on the flux adhesive material. The method further comprises reflowing the conductive member; singulating the semiconductor wafer to produce a die having the conductive layer, the polyimide layer, the conductive pillar, the flux adhesive material, and the reflowed conductive member; and coupling the reflowed conductive member to a conductive terminal using a reflow technique, thereby producing a solder layer coupling the conductive pillar to the conductive terminal. The method also comprises covering the die, the conductive pillar, the solder layer, and the conductive terminal in a molding, the conductive terminal exposed to a surface of the molding.

BRIEF DESCRIPTION OF THE DRAWINGS

For a detailed description of various examples, reference will now be made to the accompanying drawings in which.

DETAILED DESCRIPTION

As explained above, flip-chip packages, such as flip-chip quad-flat-no-leads (QFN) packages, include dies that are flipped and attached to conductive terminals of the packages using conductive members (e.g., solder balls). The conductive members are electrically and mechanically coupled to active areas of the dies through metal redistribution layers, polyimide layers, passivation layers, die pads, etc.

In many cases, the conductive members are formed by using a plating technique, such as electroplating. A reflow technique is subsequently performed on the conductive members to facilitate a die attach to the conductive terminals of a package. This technique for plating and attaching conductive members is disadvantageous for a number of reasons. For example, the technique results in unevenly-sized conductive members, thereby resulting in co-planarity challenges across an array of conductive members of a die. In addition, the technique entails the use of several expensive and time-consuming manufacturing steps, such as multiple photolithography, plating, and etching steps. This results in long manufacturing cycle times and high package costs. In addition, electromigration is a common concern, particularly with continually shrinking die sizes.

This disclosure describes various examples of packages and methods for manufacturing packages that mitigate the foregoing challenges. These examples forego the photolithography, plating, and etching steps typically used to generate conductive members (e.g., solder balls). The elimination of such steps mitigates most or all of the foregoing challenges, because such steps are expensive and tedious manufacturing steps, are prone to causing co-planarity problems, etc. In the disclosed examples, in lieu of plating the conductive members, the conductive members are preformed and are placed and subsequently held in place using a flux adhesive material. (A flux adhesive, in some examples, comprises any suitable material composed of flux, which is used in the metallurgical arts to facilitate coupling, such as soldering. Thus, for example, a flux adhesive may be used at solder-copper interfaces to mitigate copper oxidation at solder temperatures, thus facilitating adhesion between the solder and copper. The scope of this disclosure is not limited to this or any other particular type of flux adhesive. In the various instances in this disclosure that describe the use of flux adhesives, any and all other suitable materials, such as those commonly used in the metallurgical arts, may be substituted for flux adhesives to accomplish the same or similar goals as a flux adhesive.) The conductive members may later be reflowed to facilitate a die attach to the conductive terminals of a package, such as a flip-chip QFN package. Specific package architectures and methods for manufacturing the same are now described with respect to the drawings.

Figure 1:
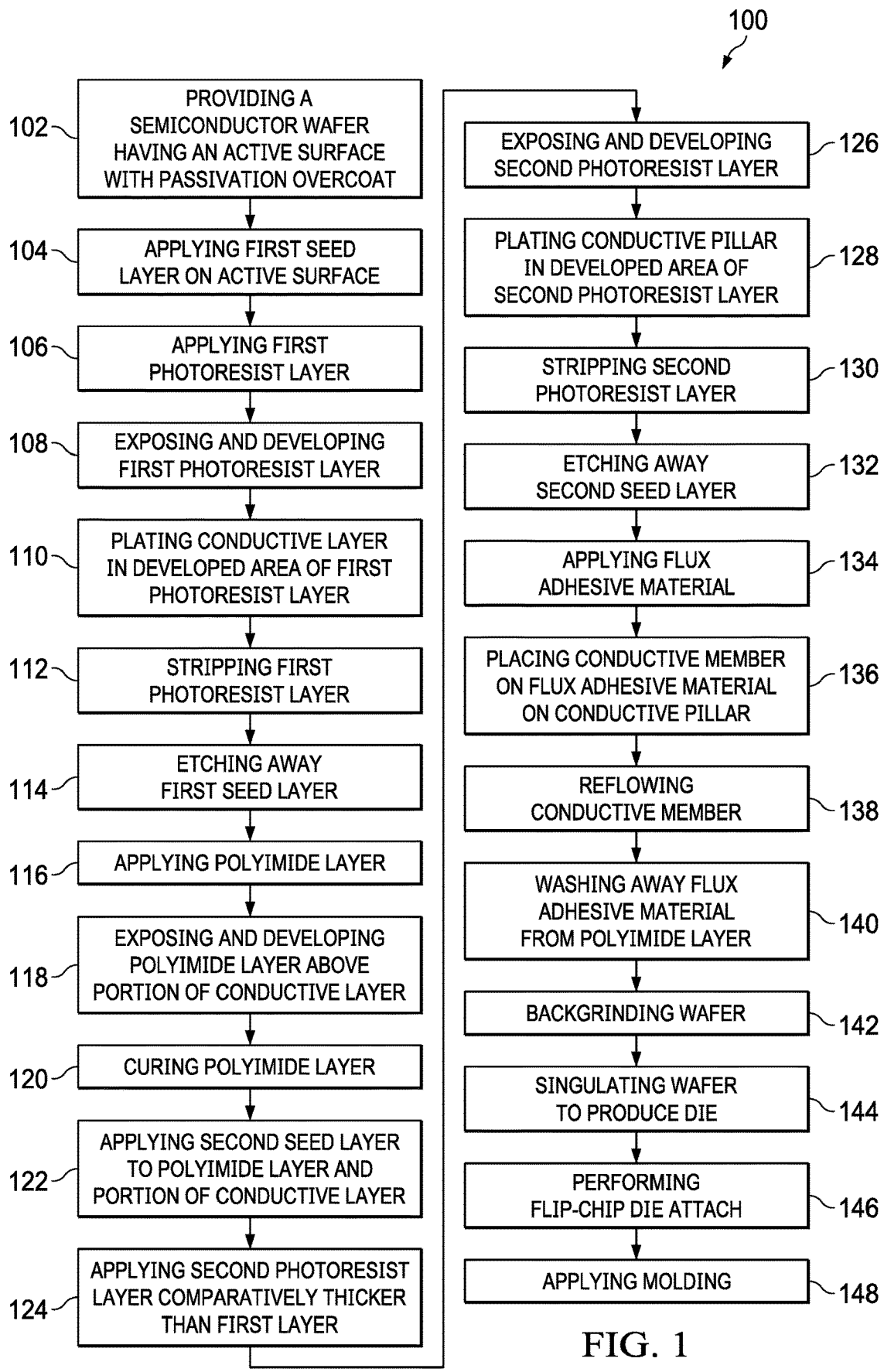
FIG. 1 depicts a flowchart of a method for manufacturing a flip-chip quad-flat-no-leads (QFN) package in accordance with various examples.
Figure 2A:
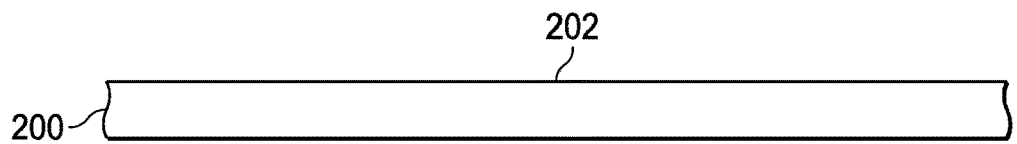
FIGS. 2A-2W depict a process flow for manufacturing a flip-chip QFN package in accordance with various examples.
Figure 2B:
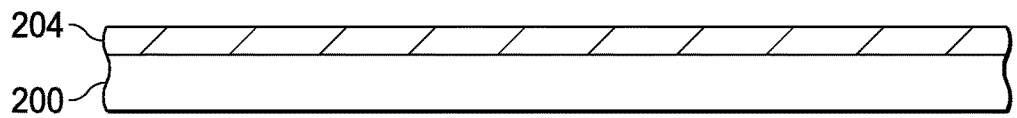
Figure 2C:
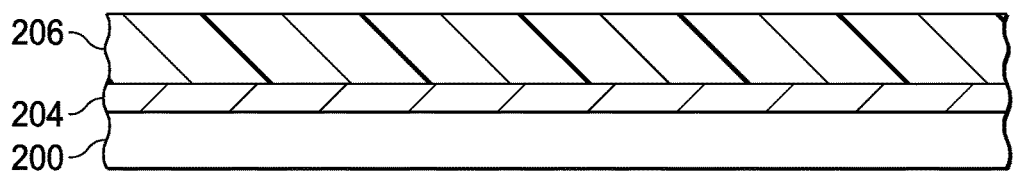
Figure 2D:
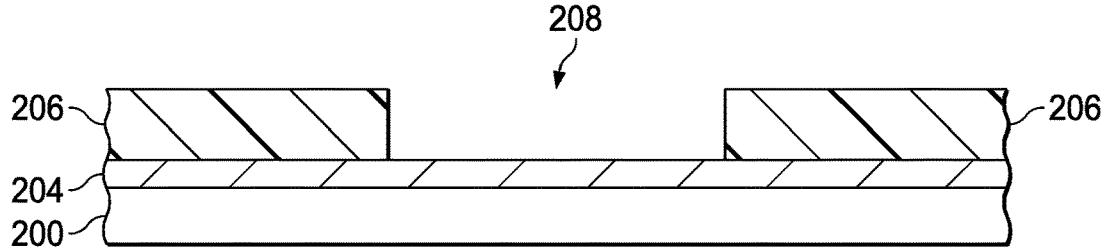
Figure 2E:
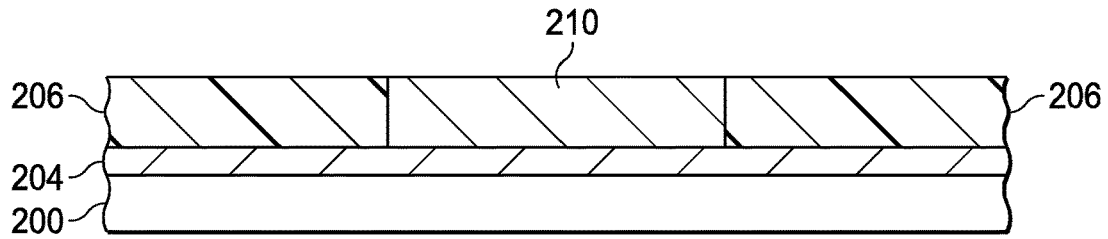
Figure 2F:
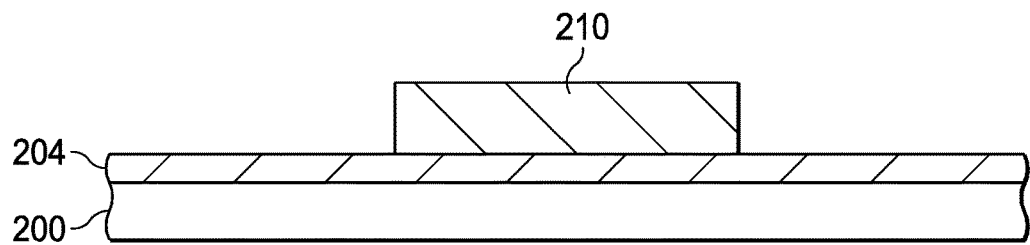
Figure 2G:
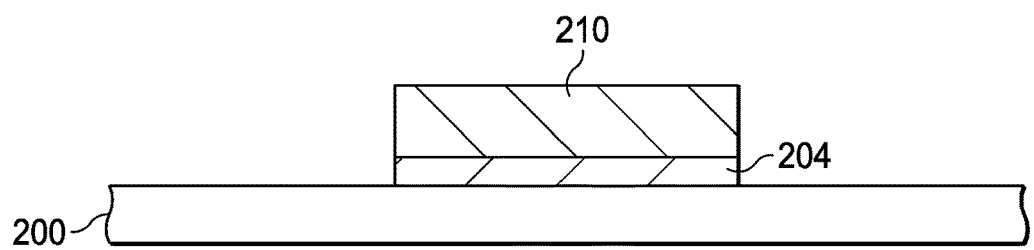

FIG. 1 depicts a flowchart of a method 100 for manufacturing a flip-chip quad-flat-no-leads (QFN) package in accordance with various examples. The method 100 of FIG. 1 is described in tandem with FIGS. 2A-2W, which depict a process flow for manufacturing a flip-chip QFN package in accordance with various examples. As described below, in some examples, the techniques of FIGS. 1-2W do not include plating solder material for the purpose of a flip-chip die attach to conductive terminals. Instead, as described, the techniques of FIGS. 1-2W include placing a conductive member (e.g., a solder ball) on an adhesive material, such as a flux adhesive material, and this conductive member is subsequently reflowed for the purpose of a flip-chip die attach to conductive terminals (e.g., of a leadframe). This results in mitigation of the challenges described above.

Figure 2H:
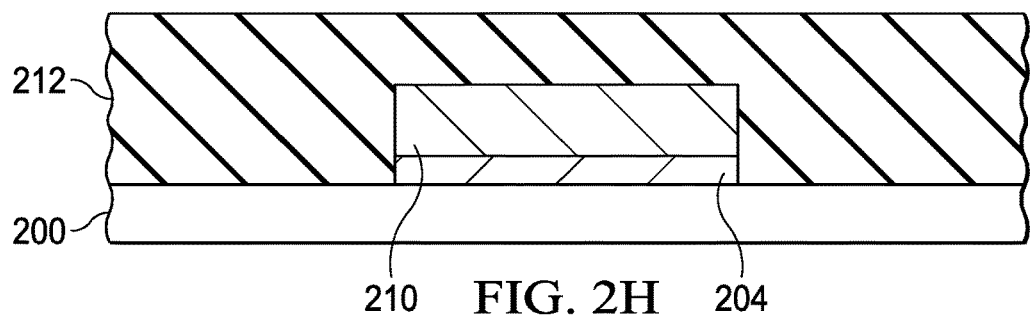
Figure 2I:
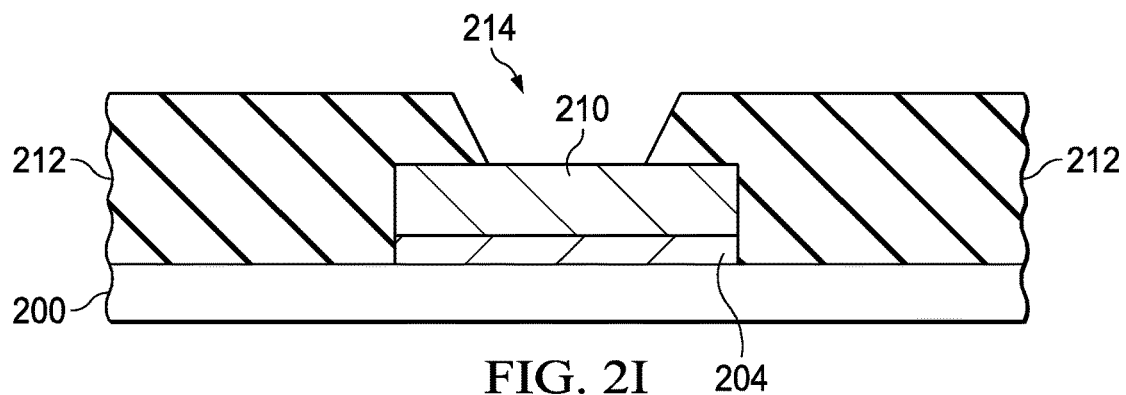
Figure 2J:
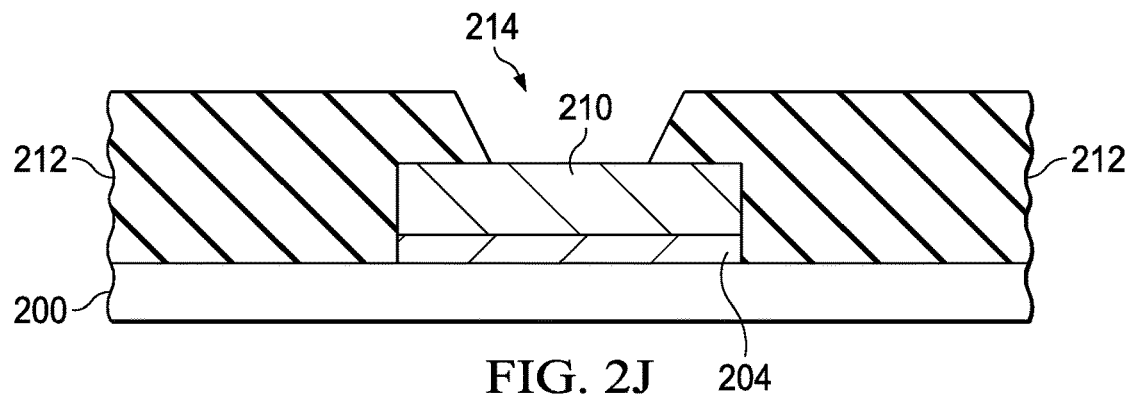
Figure 2K:
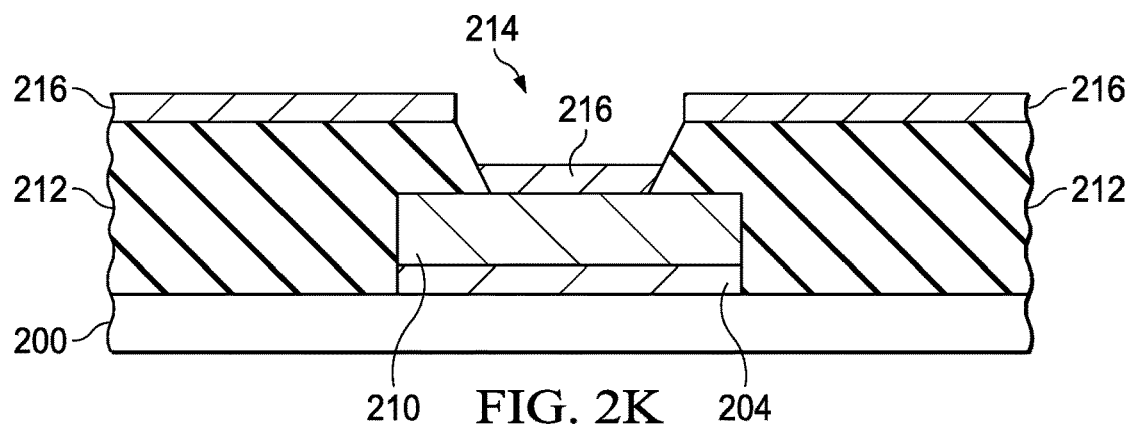
Figure 2L:
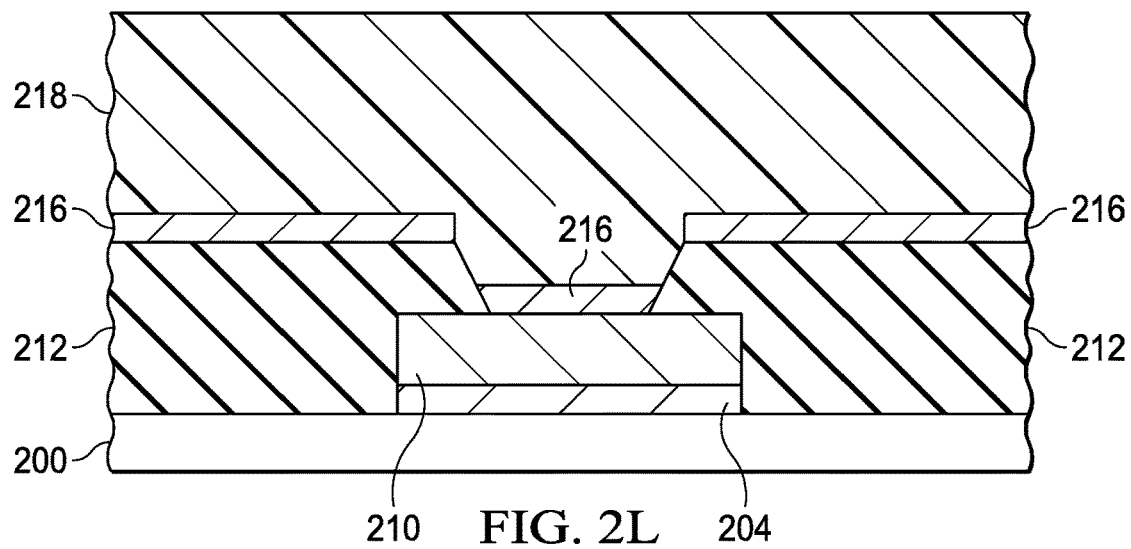
Figure 2M:
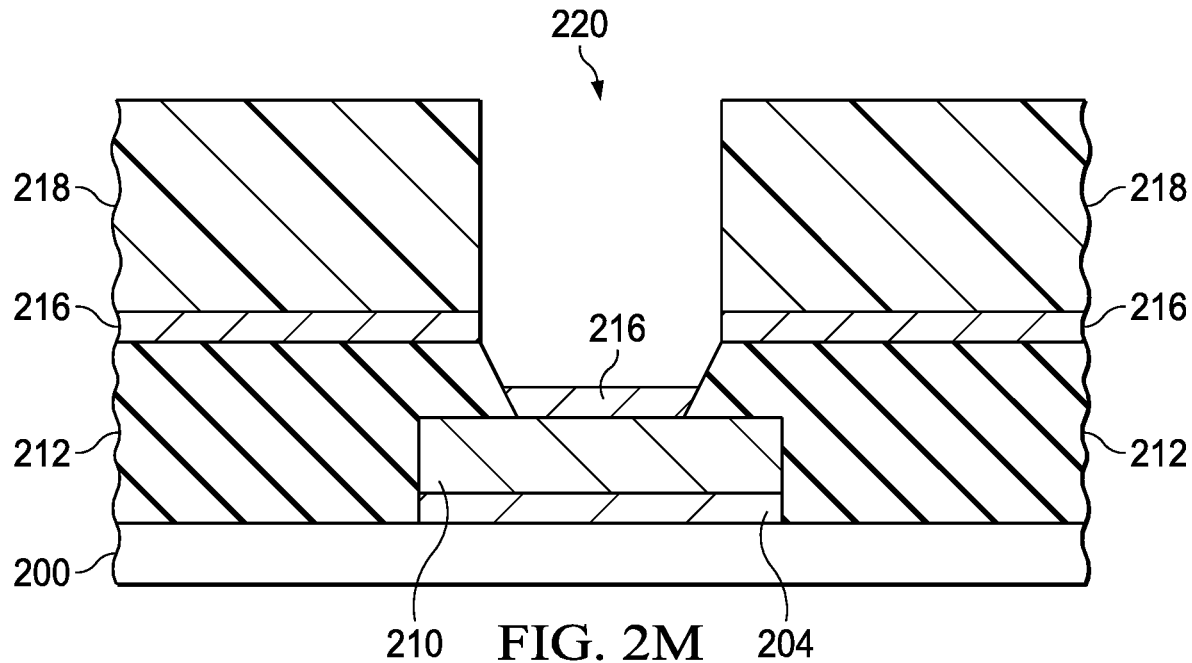
Figure 2N:
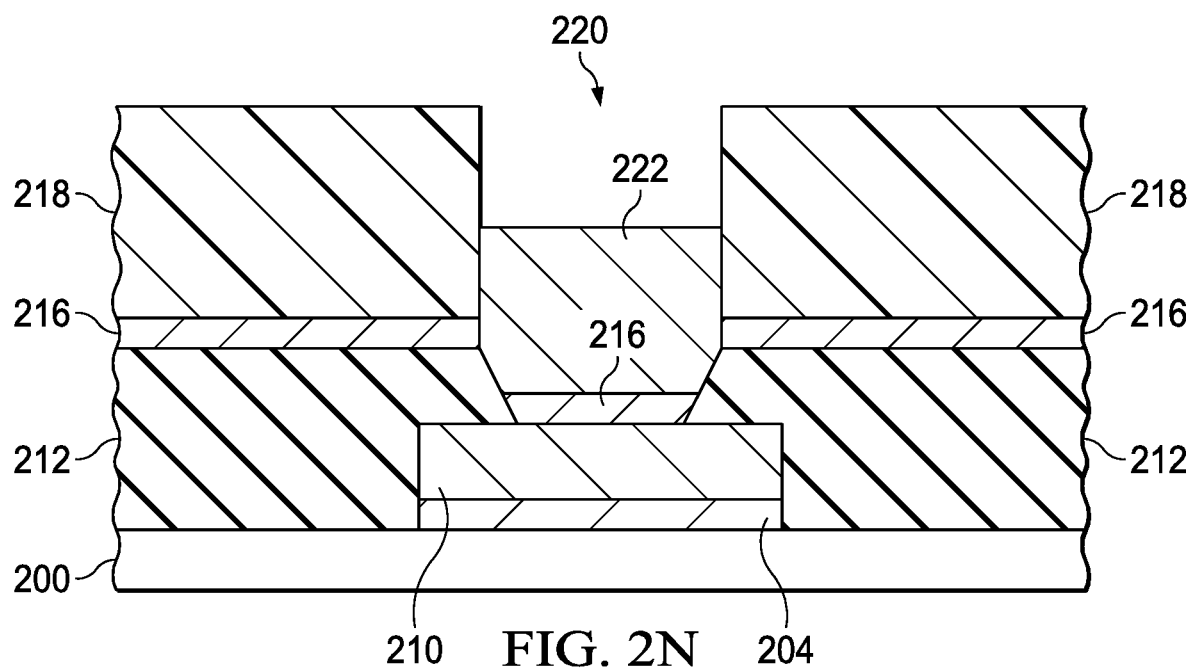
Figure 2O:
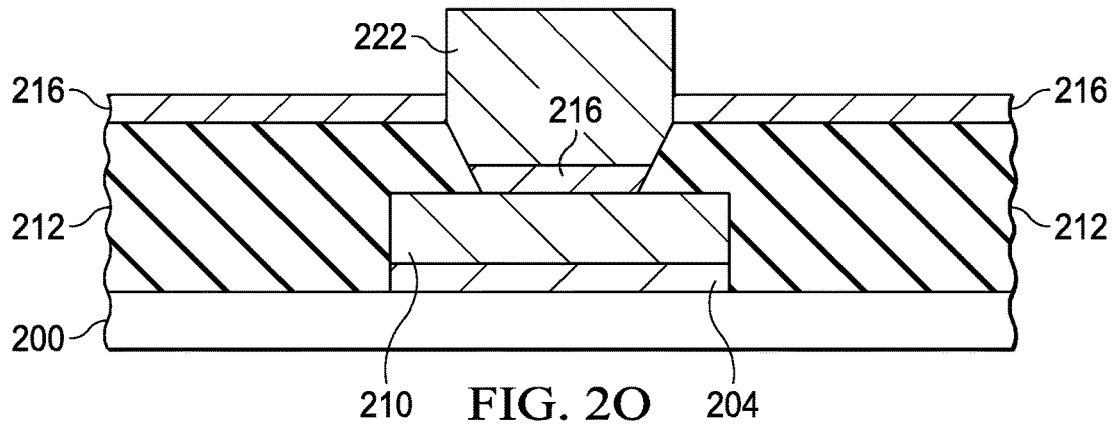
Figure 2P:
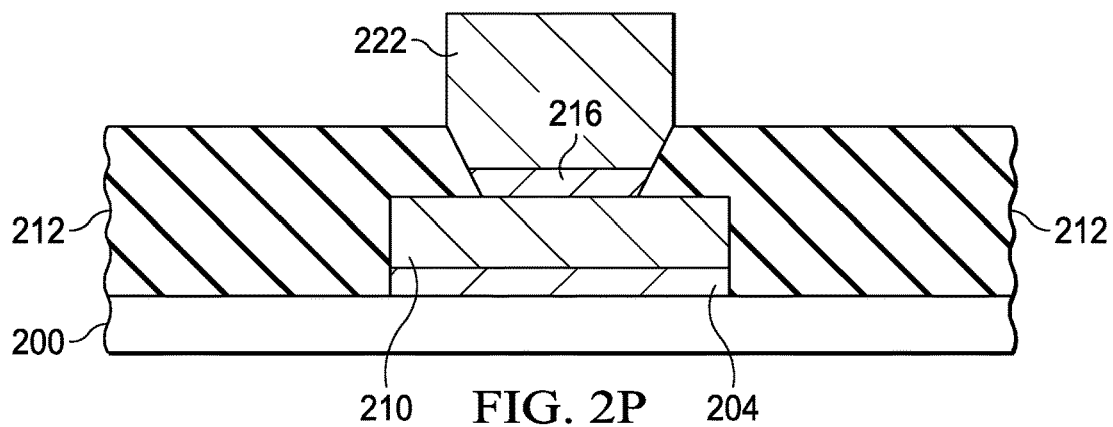
Figure 2Q:
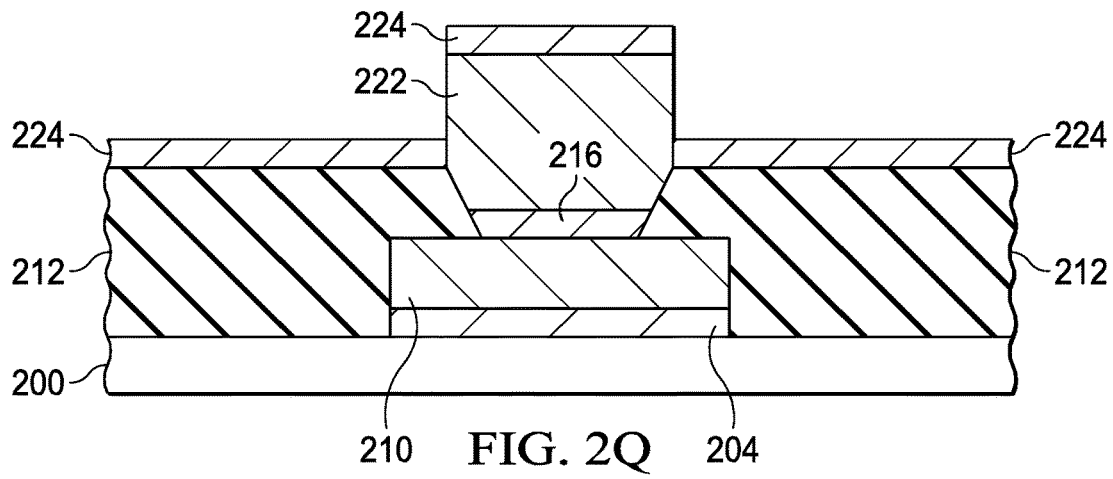
Figure 2R:
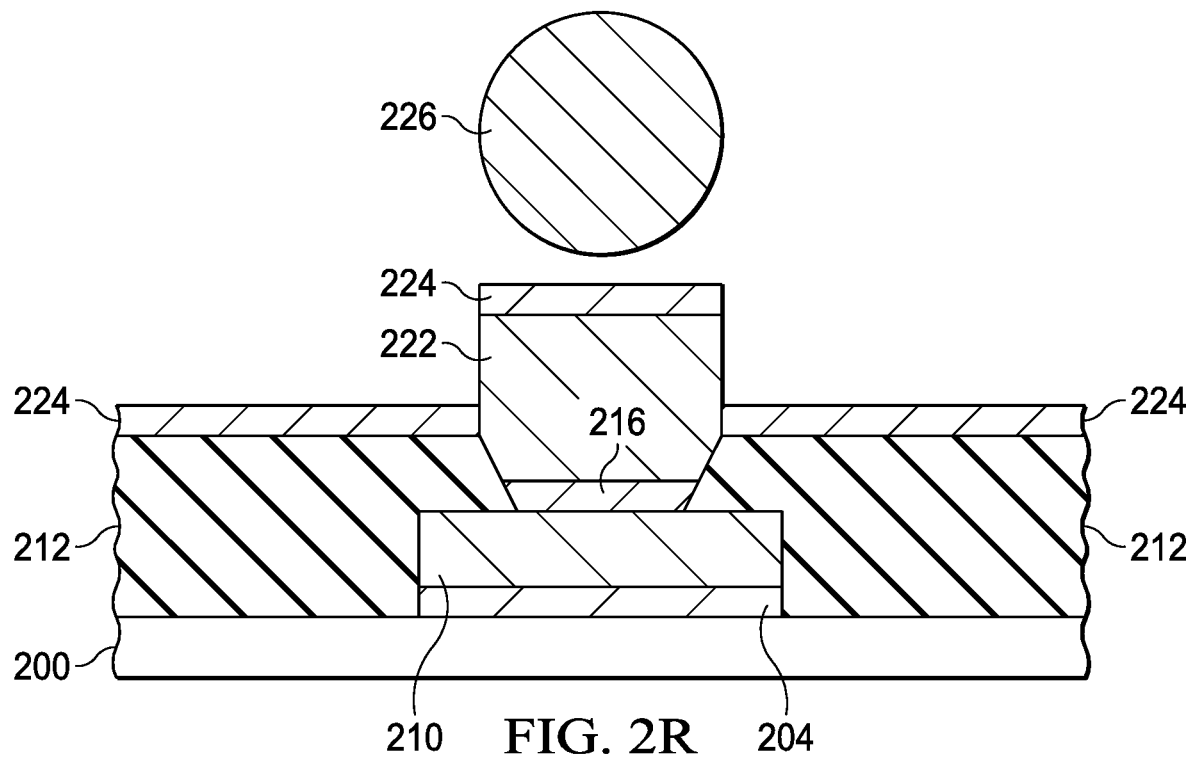
Figure 2S:
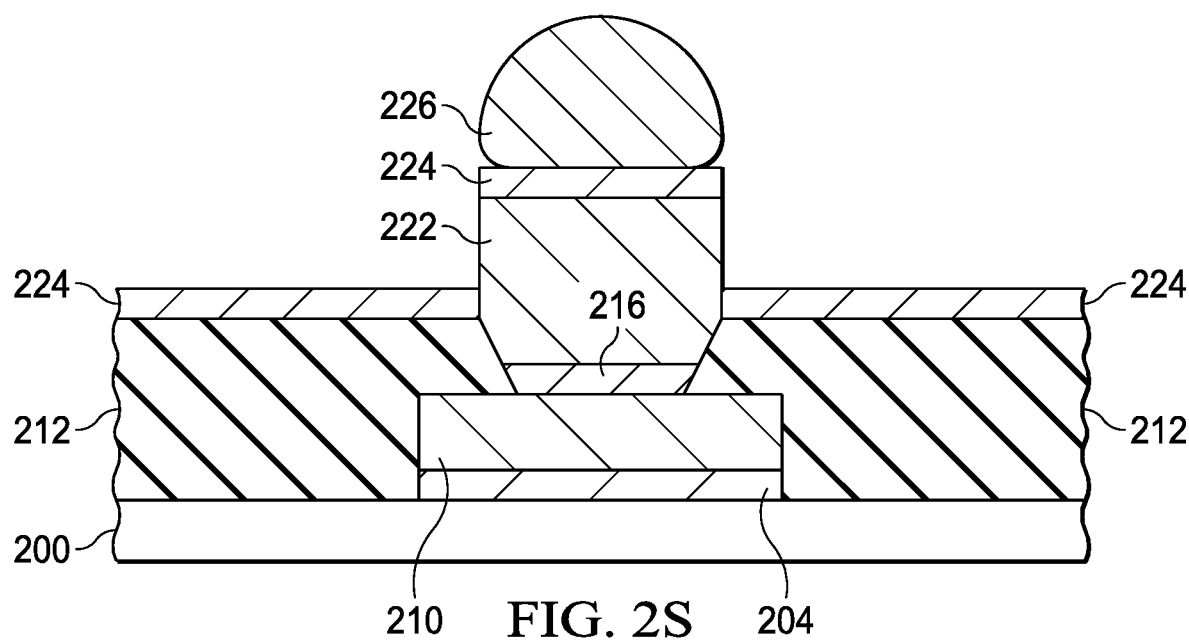
Figure 2T:
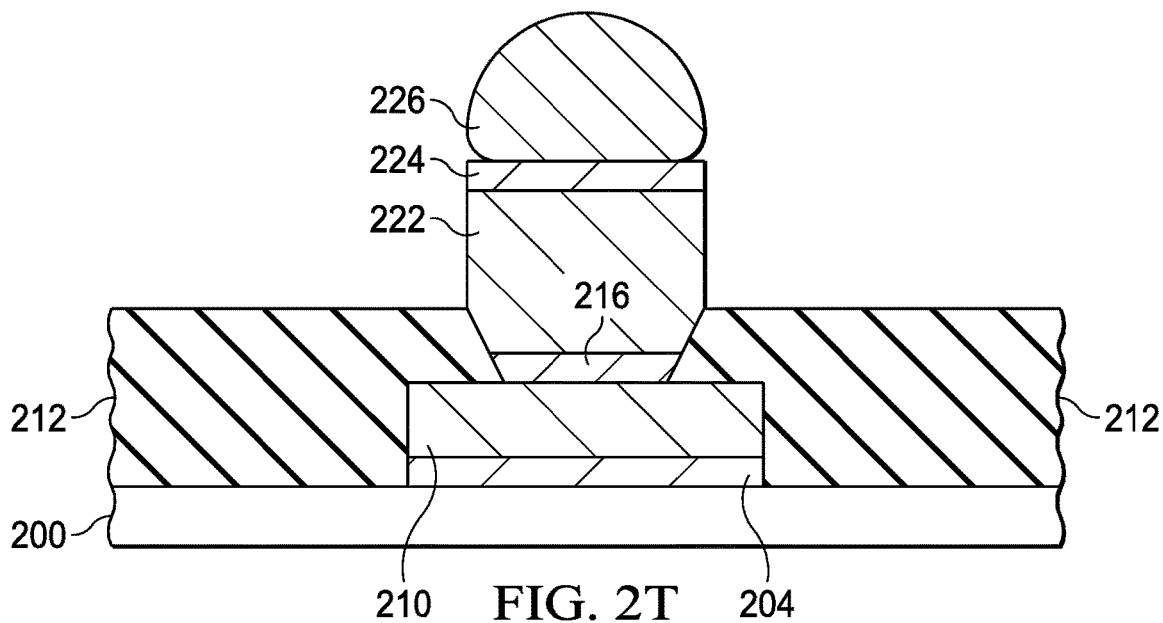
Figure 2U:
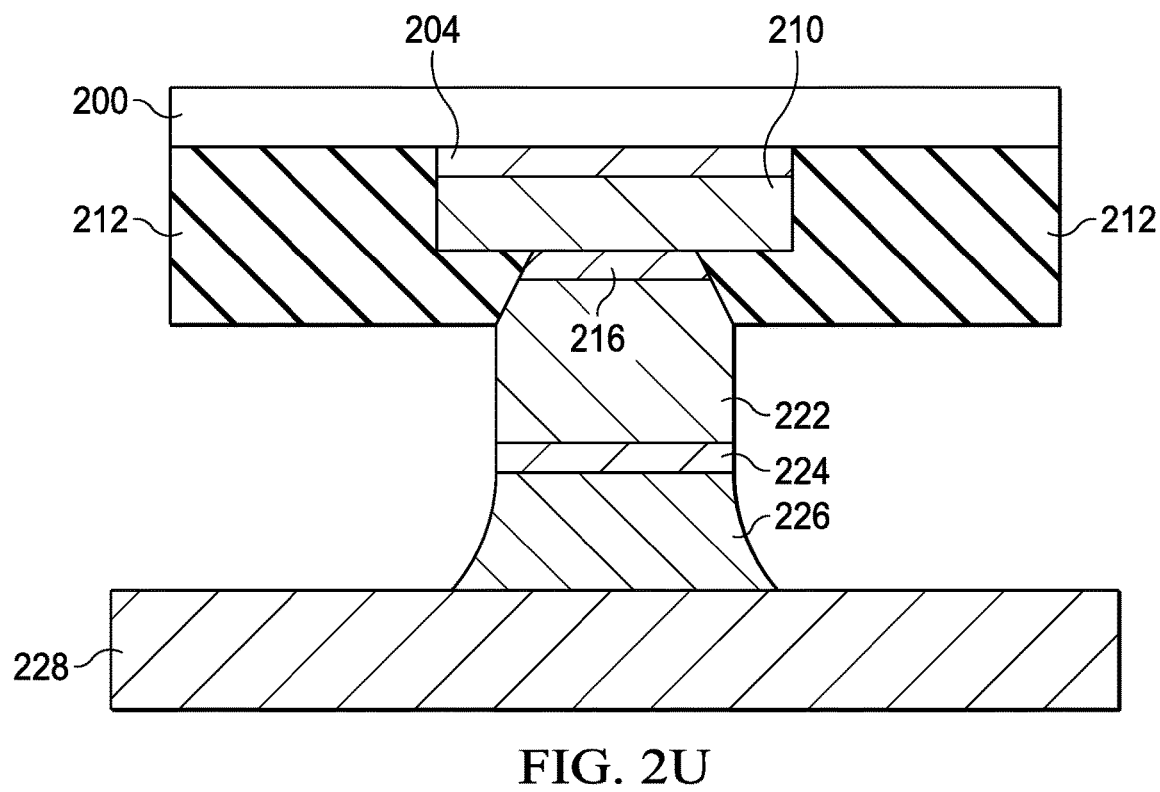
Figure 2V:
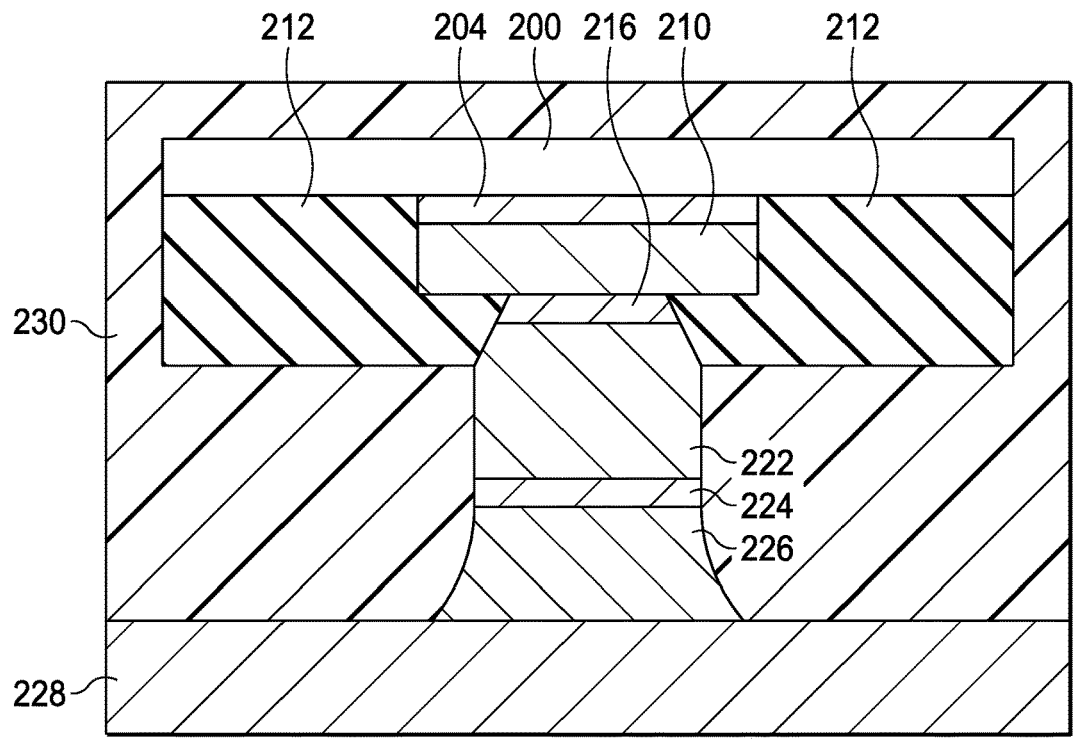
Figure 2W:
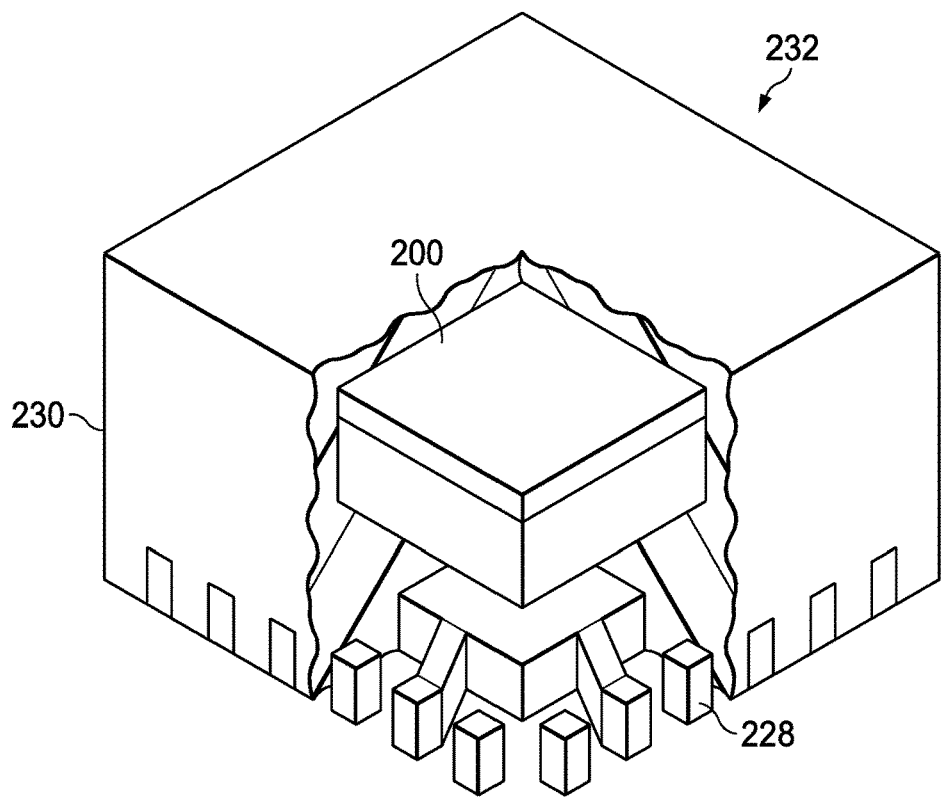

Referring now to FIGS. 1-2W, the method 100 begins by providing a semiconductor wafer having an active surface and a passivation overcoat 102. FIG. 2A depicts a portion of a semiconductor wafer 200, such as a silicon wafer. Circuitry (not expressly shown) is fabricated on an active surface 202 of the semiconductor wafer 200, and a passivation overcoat (not expressly shown) is applied to the active surface 202. The circuitry and the passivation overcoat are omitted from the drawings to improve the clarity of illustration. Nevertheless, the passivation overcoat is patterned on the active surface 202 to enable coupling of conductive structures formed above the active surface 202 to circuitry formed on the active surface 202. The method 100 then comprises depositing a first seed layer on the active surface 104. FIG. 2B depicts a seed layer 204 having been applied on the active surface 202. For example, the seed layer 204 may comprise copper or tin-tungsten alloy and may be sputtered or applied by physical vapor deposition (PVD). The method 100 further comprises applying a first photoresist layer 106. FIG. 2C depicts a photoresist layer 206 positioned on the seed layer 204. In some examples, the thickness of the photoresist layer 206 ranges from 10 to 20 microns. The method 100 next comprises exposing and developing the first photoresist layer 108. As FIG. 2D depicts, an orifice 208 is formed in the photoresist layer 206 following exposure and development using appropriate mask patterns. In some examples, the open area (e.g., in a horizontal plane) of the orifice 208 ranges from 40 to 80% of the area of the photoresist layer 206, and the thickness of the orifice 208 matches that of the photoresist layer 206. The method 100 then comprises plating a conductive layer in the developed area of first photoresist layer 110. As FIG. 2E depicts, a conductive layer 210 is plated (e.g., through electroplating or electro-less plating) in the orifice 208 using the seed layer 204. In some examples, the conductive layer 210 has a thickness ranging from 5 to 15 microns and/or a copper density ranging from 40 to 80%. In some examples, the conductive layer 210 has a maximum thickness of 10 microns. In some examples, the conductive layer 210 comprises copper, although other conductive materials (e.g., aluminum) are also contemplated. The method 100 then comprises stripping away the first photoresist layer 112. FIG. 2F depicts the photoresist 206 having been stripped away, leaving the seed layer 204, the conductive layer 210, and the wafer 200 remaining. In step 114 of FIG. 1, the first seed layer is etched away, as FIG. 2G depicts with the removal of the seed layer 204 from the semiconductor wafer 200.

The method 100 continues by applying a polyimide layer to the conductive layer and the active surface of the semiconductor wafer 116. FIG. 2H depicts a polyimide layer 212 coupled to the conductive layer 210 and the semiconductor wafer 200. In some examples, the polyimide layer 212 has a thickness ranging from 7 to 15 microns. The method 100 subsequently comprises exposing and developing the polyimide layer above a portion of the conductive layer 118. For example, FIG. 2I depicts an orifice 214 formed above a portion of the conductive layer 210 following exposure and development of the polyimide layer 212 using appropriate mask patterns. In examples, the thickness of the orifice 214 ranges from 7 to 15 microns and/or the width of the orifice ranges from 40 to 80 microns. The polyimide layer is then cured 120, as FIG. 2J depicts.

The method 100 still further continues by applying a second seed layer to the polyimide layer and to a portion of the conductive layer 122. FIG. 2K depicts this seed layer 216 having been applied to the polyimide layer 212 and the conductive layer 210. In some examples, the seed layer 216 comprises copper or a tin-tungsten alloy, and in some examples the seed layer 216 is applied using either a sputtering technique or a PVD technique. The method 100 then includes applying a second photoresist layer that is comparatively thicker than the first layer 124. For example, FIG. 2L depicts the application of a photoresist layer 218 on the seed layer 216. In examples, the photoresist layer 218 has a thickness ranging from 60 to 140 microns, which is greater than the thickness of the photoresist layer 206, which—as explained above—ranges from 10 to 20 microns. The method 100 comprises exposing and developing the second photoresist layer 126. As FIG. 2M shows, an orifice 220 is formed in the photoresist layer 218 following the exposure and development of the photoresist layer 218 using appropriate mask patterns. In some examples, the width of the orifice 220 is comparable to the width of the orifice 214. In some examples, the width of the orifice 220 ranges from 50 to 100 microns. In examples, the thickness of the orifice 220 ranges from 60 to 140 microns. The method 100 comprises plating a conductive pillar in the developed area of the second photoresist layer 128. For instance, as FIG. 2N depicts, a conductive pillar 222 is formed in the orifice 220 using a plating technique (e.g., electroplating, electro-less plating). In some examples, the conductive pillar 222 has a thickness ranging from 40 to 70 microns. The method 100 comprises stripping the second photoresist layer 130, as FIG. 2O shows with the removal of the photoresist layer 218, and the method 100 also comprises etching away the second seed layer 132, which FIG. 2P depicts with the removal of the seed layer 216.

The method 100 continues by applying a flux adhesive material 134. As FIG. 2Q depicts, a flux adhesive material 224 is applied to the polyimide layer 212 and the conductive pillar 222. In some examples, the flux adhesive material 224 is applied using a squeegee and has a thickness ranging from 20 to 40 microns. Other types of adhesives are contemplated and fall within the scope of this disclosure. The method 100 comprises placing (e.g., dropping) a conductive member on the flux adhesive material on the conductive pillar 136. For example, in FIG. 2R, a conductive member 226 (e.g., solder) is positioned on the flux adhesive material 224 on the conductive pillar 222. In some instances, the conductive member 226 is a solder ball that is placed using a stencil and brush technique or using a cyclone technique. In some examples, the conductive member 226 is a spherical conductive material that has a diameter of 60 to 80 microns. In some examples, the conductive member 226 has a maximum diameter of 80 microns. In some examples, the conductive member 226 is a different shape than a sphere, e.g., a rectangular prism, another type of prism, or any other suitable shape. The conductive member 226 in these instances may be sized as appropriate. In some such examples, the size of the conductive member 226 is such that the volume of the conductive member 226 is approximately similar to that of a sphere with a 60 to 80 micron diameter. (The term "sphere," as used herein, refers to any shape that one of ordinary skill in the art would recognize as being spherical. A shape may be spherical even if it is not a perfect sphere. For example, an ovoid shape may be considered spherical.) The aforementioned illustrative sizes of the conductive member 226 are not mere design choices, but rather have effects on the structure and operation of the examples described herein. For example, these sizes may impact the electromigration performance, void mitigation, and bond line thickness properties of the examples described herein.

The method 100 then comprises reflowing the conductive member 138. FIG. 2S depicts the conductive member 226 having been reflowed. FIG. 2S depicts the flux adhesive material 224 positioned under the conductive member 226, but the placement and reflowing of the conductive member 226 may alter the shape, overall size, thickness, continuity, and position of the portion of the flux adhesive material 224 under the conductive member 226. Nevertheless, the flux adhesive material 224 is still present under the conductive member 226. At 140, the portion of the flux adhesive material that is not under the conductive member is washed away. As FIG. 2T depicts, the portion of the flux adhesive material 224 that is not under the conductive member 226 is washed away (e.g., from the polyimide layer 212).

The method 100 comprises backgrinding the wafer 142 and singulating the wafer (e.g., using a sawing technique) to produce a die 144 that includes the structures depicted in FIG. 2T. The method 100 further comprises flipping and attaching the structure of FIG. 2T to a conductive terminal 146. For example, FIG. 2U depicts the structure of FIG. 2T flipped upside down and attached (e.g., by reflowing the conductive member 226 to form a conductive layer 226, such as a solder layer) to a conductive terminal 228. In some examples, the conductive layer 226 has a volume that is approximately equivalent to that of a sphere (e.g., a solder sphere) having a diameter ranging from 60 to 80 microns. The method 100 also comprises applying a molding, such as epoxy 148, as FIG. 2V depicts with the application of molding 230 (e.g., using an injection technique). FIG. 2W depicts a three-dimensional cutaway view of a flip-chip QFN package 232 comprising the molding 230 covering the conductive terminal 228, a portion of the semiconductor wafer 200, and the remaining structures depicted in FIG. 2V.

Figure 3:
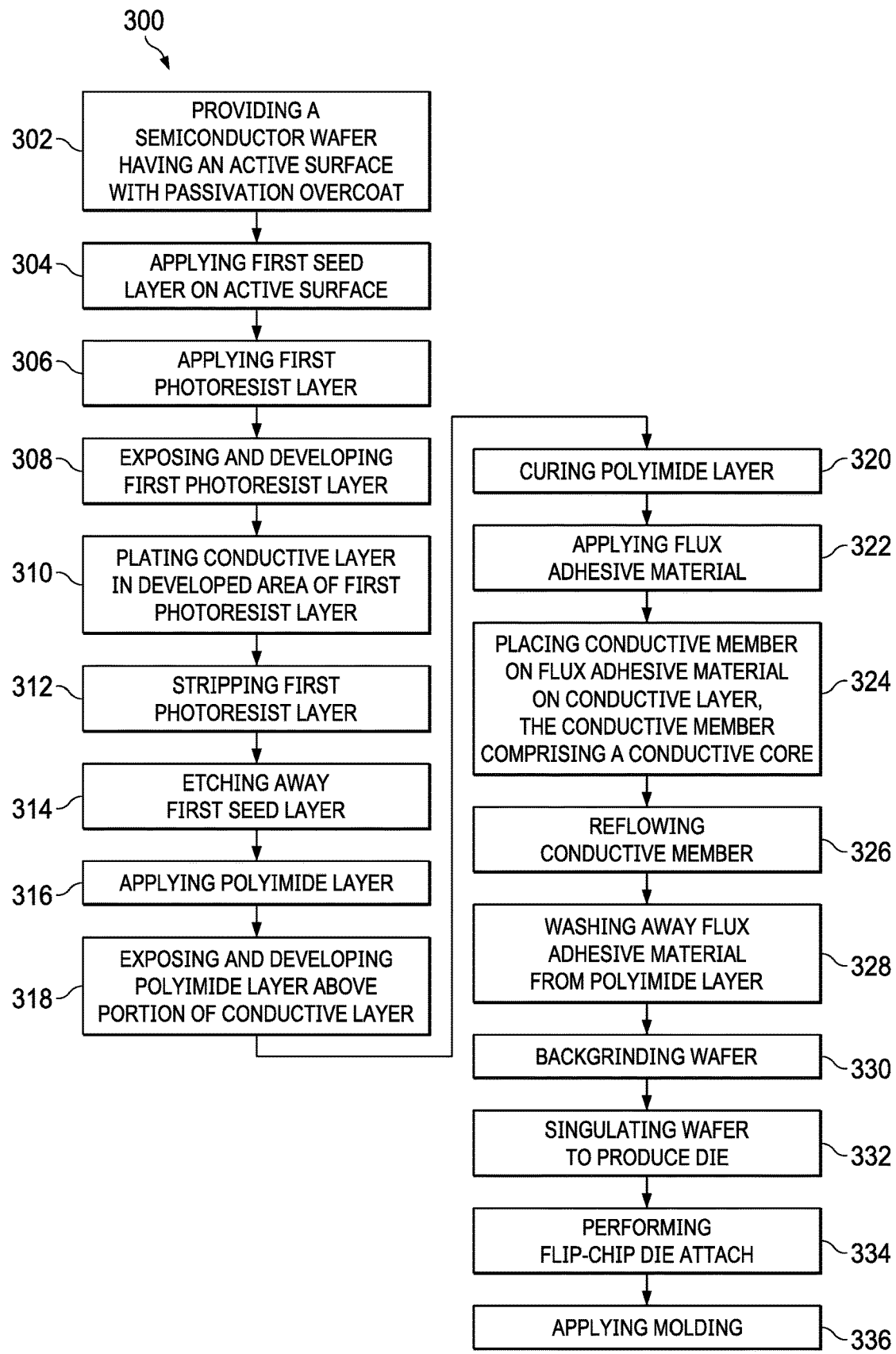
FIG. 3 depicts a flowchart of a method for manufacturing a flip-chip QFN package in accordance with various examples.
Figure 4A:
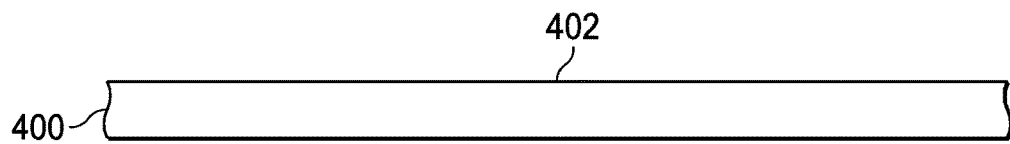
FIGS. 4A-4Q depict a process flow for manufacturing a flip-chip QNF package in accordance with various examples.
Figure 4B:
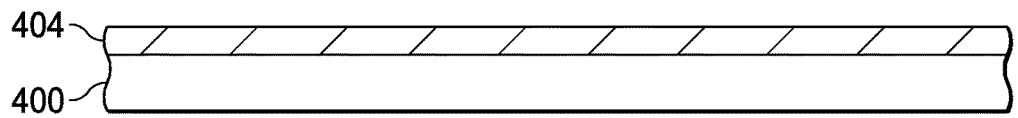
Figure 4C:
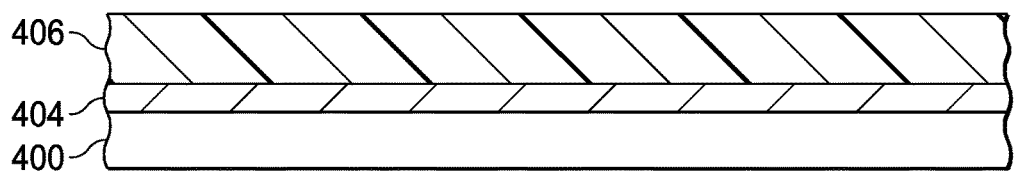
Figure 4D:
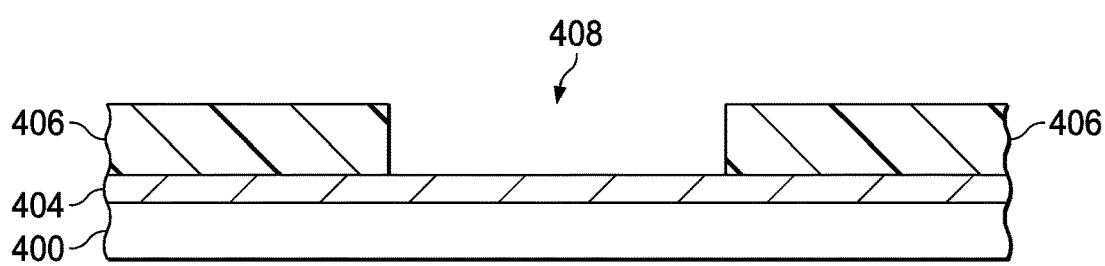
Figure 4E:
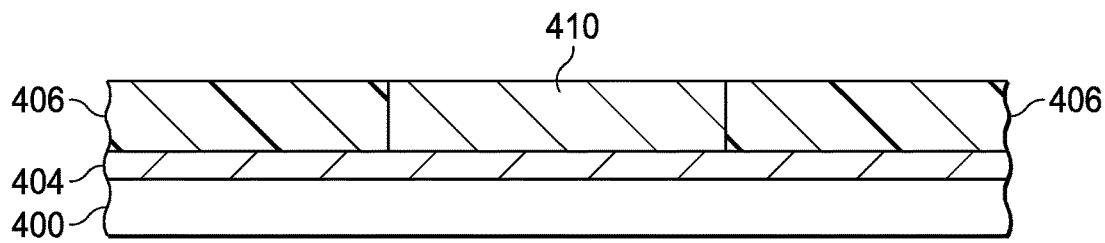
Figure 4F:
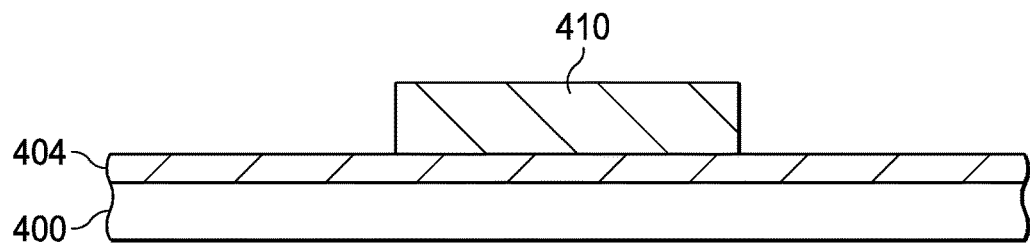
Figure 4G:
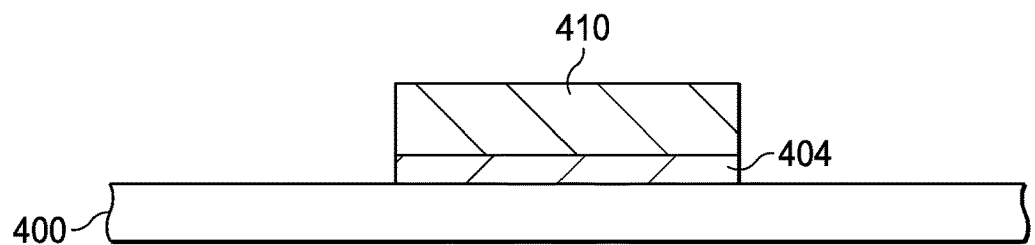
Figure 4H:
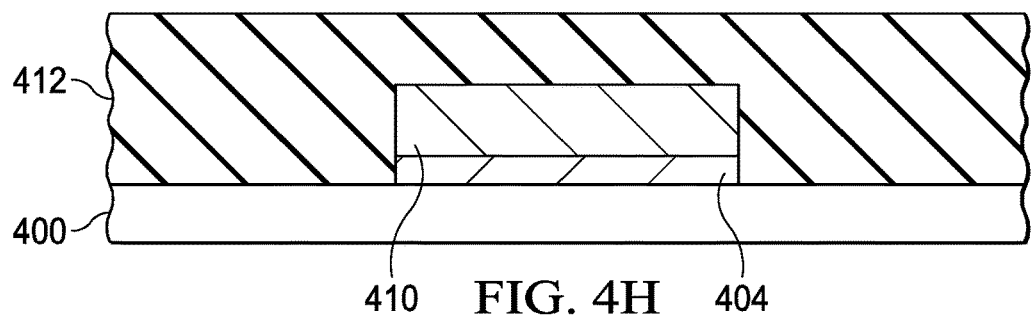
Figure 4I:
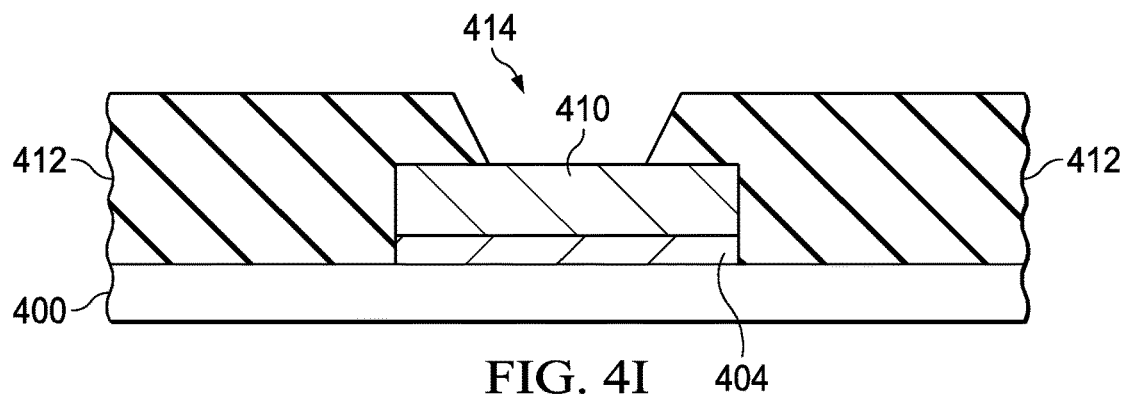
Figure 4J:
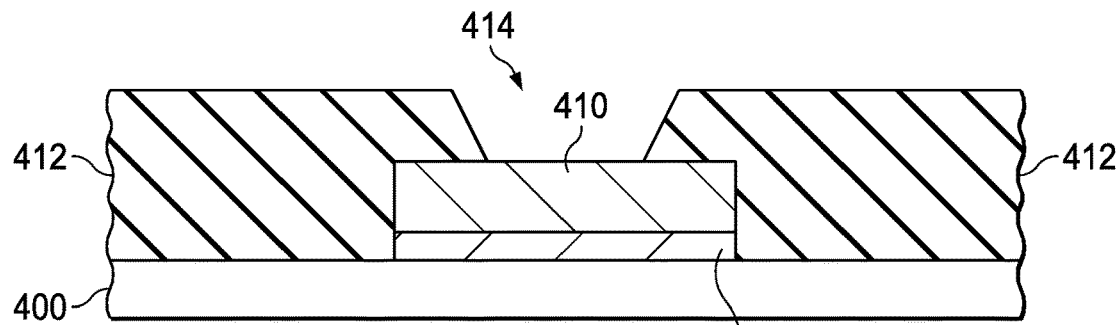
Figure 4K:
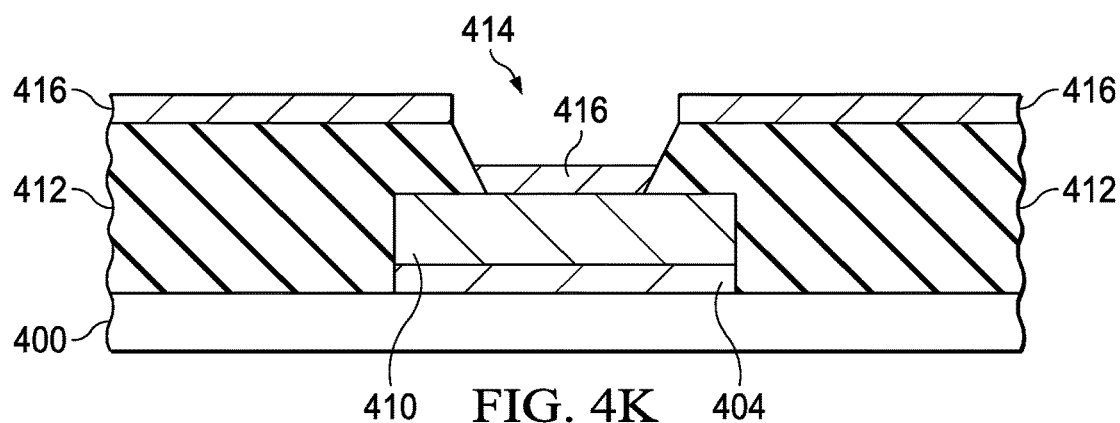
Figure 4L:
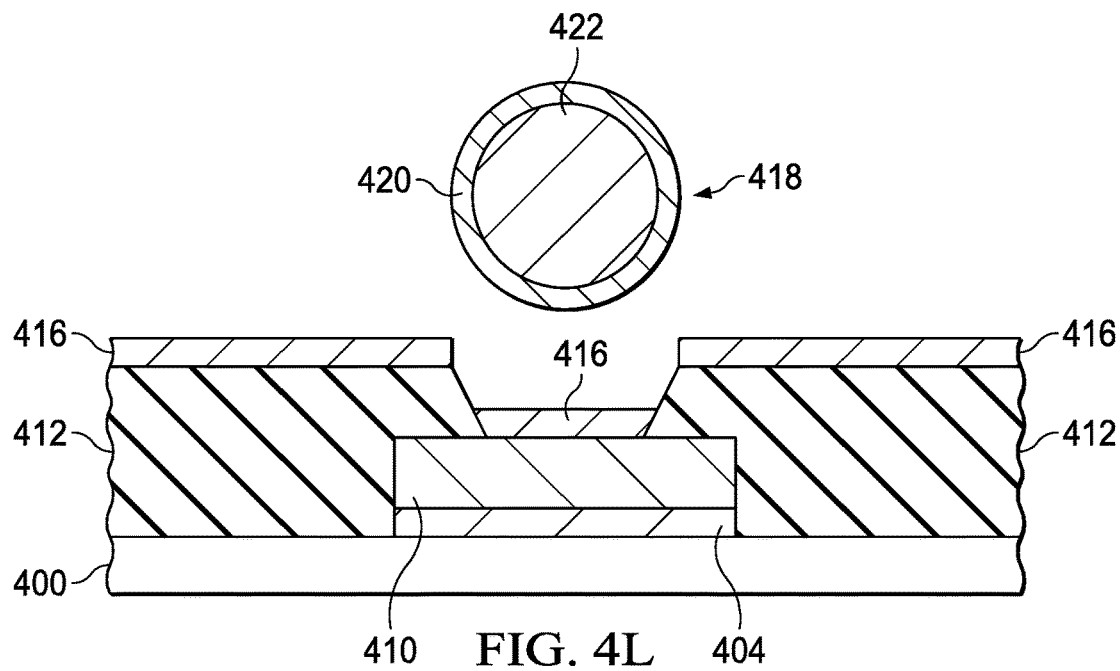

FIG. 3 depicts a flowchart of a method 300 for manufacturing a flip-chip QFN package in accordance with various examples. The method 300 is described in tandem with FIGS. 4A-4Q, which depict a process flow for manufacturing a flip-chip QNF package in accordance with various examples. Unlike the examples of FIGS. 1-2W, which entail the use of a conductive member 226 (e.g., solder ball), the examples of FIGS. 3-4Q entail the use of a conductive member that includes a conductive core (e.g., a copper core) and a reflowable, conductive outer layer (e.g., a solder outer layer covering the conductive core). The use of a conductive member that includes a conductive core and a reflowable, conductive outer layer facilitates the manufacture of a conductive pillar (similar to the conductive pillar 222 in FIG. 2U) and die attach layer (similar to the solder layer 226 in FIG. 2U) while using fewer photolithography, plating, and etching steps than are used in other manufacturing methodologies. FIGS. 3-4Q are now described.

The method 300 begins by providing a semiconductor wafer having an active surface with a passivation overcoat 302. For example, FIG. 4A depicts a semiconductor wafer 400, such as a silicon wafer, that has circuitry formed on an active surface 402. The circuitry and the passivation overcoat are omitted from the drawings to improve the clarity of illustration. Nevertheless, the passivation overcoat is patterned on the active surface 402 to enable coupling of conductive structures formed above the active surface 402 to circuitry formed on the active surface 402. The method 300 then comprises applying a first seed layer on the active surface 304. FIG. 4B depicts the application of a first seed layer 404 on the active surface 402. The seed layer 404 may comprise copper or a tin-tungsten alloy, in examples. In some instances, the seed layer 404 is applied using a sputtering technique, and in other instances, the seed layer 404 is positioned using a PVD technique.

The method 300 continues by applying a first photoresist layer 306. FIG. 4C depicts the application of a photoresist layer 406 on the seed layer 404. In some examples, the thickness of the photoresist layer 406 ranges from 10 to 20 microns. The method 300 comprises exposing and developing the first photoresist layer 308. FIG. 4D depicts the formation of an orifice 408 in the photoresist layer 406 following exposure and development of the photoresist layer 406 using appropriate mask patterns. In some examples, the width of the orifice 408 ranges from 40 to 80 microns, and/or the open area of the orifice 408 ranges from 40 to 80% of the area of the photoresist layer 406.

The method 300 further includes plating a conductive layer in a developed area of the first photoresist layer 310. FIG. 4E depicts the formation of a conductive layer 410 in the orifice 408 (FIG. 4D) following a plating process (e.g., electroplating process). In some examples, the conductive layer 410 comprises copper, although the scope of this disclosure is not limited as such. In some examples, the conductive layer 410 has a thickness ranging from 5 to 15 microns and/or a copper density ranging from 40 to 80%. The method 300 also comprises stripping away the first photoresist layer 312. As FIG. 4F depicts, the photoresist layer 406 (FIG. 4E) is stripped away, leaving the semiconductor wafer 400, the seed layer 404, and the conductive layer 410 remaining. The method 300 comprises etching away the first seed layer 314 as FIG. 4G depicts, leaving the semiconductor wafer 400 and the conductive layer 410.

The method 300 then comprises applying a polyimide layer 316. FIG. 4H depicts the application of a polyimide layer 412. The polyimide layer 412 abuts the semiconductor wafer 400 and the conductive layer 410. In examples, the polyimide layer 412 has a thickness ranging from 7 to 15 microns. The method 300 comprises exposing and developing the polyimide layer above a portion of the conductive layer 318. FIG. 4I depicts the creation of an orifice 414 above a portion of the conductive layer 410 using appropriate masks and photolithography steps. In some examples, the orifice 414 has a thickness ranging from 7 to 15 microns and a width ranging from 50 to 100 microns. In some examples, the polyimide layer 412 extends farther away from the active surface 402 of the semiconductor wafer 400 than does the conductive layer 410. The method 300 then comprises curing the polyimide layer 320, as FIG. 4J depicts with the curing of the polyimide layer 412.

The method 300 subsequently comprises applying a flux adhesive material to the conductive layer 410 and the polyimide layer 412 322. FIG. 4K depicts the application of a flux adhesive material 416. In some examples, the flux adhesive material 416 is applied using a squeegee. In some examples, the thickness of the flux adhesive material 416 ranges from 20 to 40 microns. The method 300 comprises placing a conductive member on the flux adhesive material on the conductive layer, where the conductive member comprises a conductive core 324. FIG. 4L depicts the placement of a conductive member 418 on the portion of the flux adhesive material 416 that abuts the conductive layer 410. In examples, the conductive member 418 is placed (e.g., dropped) using a stencil and brush technique or a cyclone technique. In examples, the conductive member 418 is a sphere having a diameter ranging from 60 microns to 80 microns, although other diameters and shapes are contemplated and included within the scope of this disclosure. In examples, the conductive member 418 comprises a conductive core 422 (e.g., a copper core) and a reflowable, conductive outer layer 420 (e.g., solder). In examples, the conductive core 422 is a conductive sphere. In examples, the outer layer 420 is a conductive sphere. In examples, the conductive core 422 has a diameter of 60 microns or less. In examples, the outer layer 420 has a volume that is approximately equivalent to that of a sphere having a diameter ranging between 60 and 80 microns minus a volume of the conductive core 422. In examples where the conductive member 418 is not a sphere and is instead a prism or other shape, the conductive core 422 may still be a sphere, a shape matching that of the conductive member 418, or a different shape. Any and all such variations are included in the scope of this disclosure. The aforementioned example sizes of the conductive member 418, the conductive core 422, and the outer layer 420 are not mere design choices, but rather have significant effects on the structure and operation of the examples described herein, such as those described above.

Figure 4M:
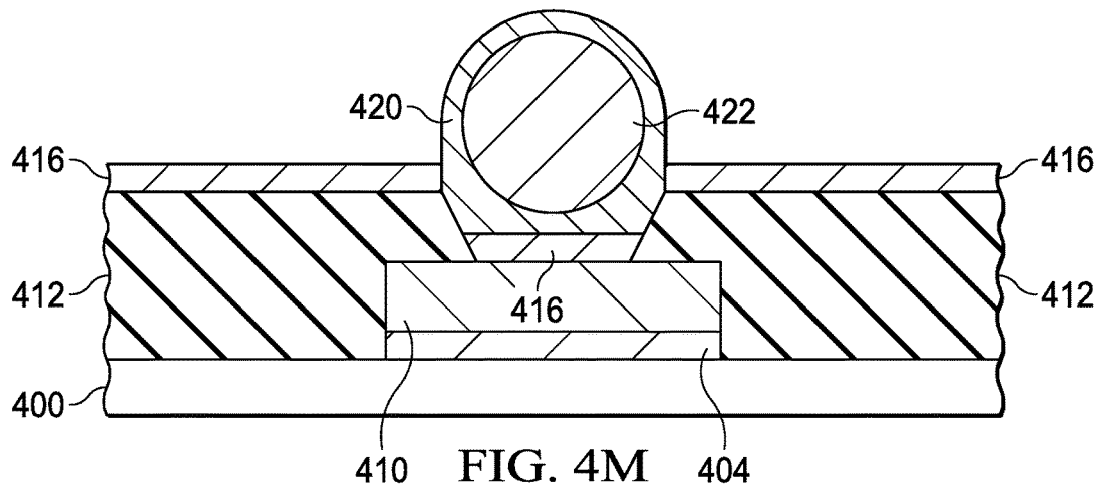
Figure 4N:
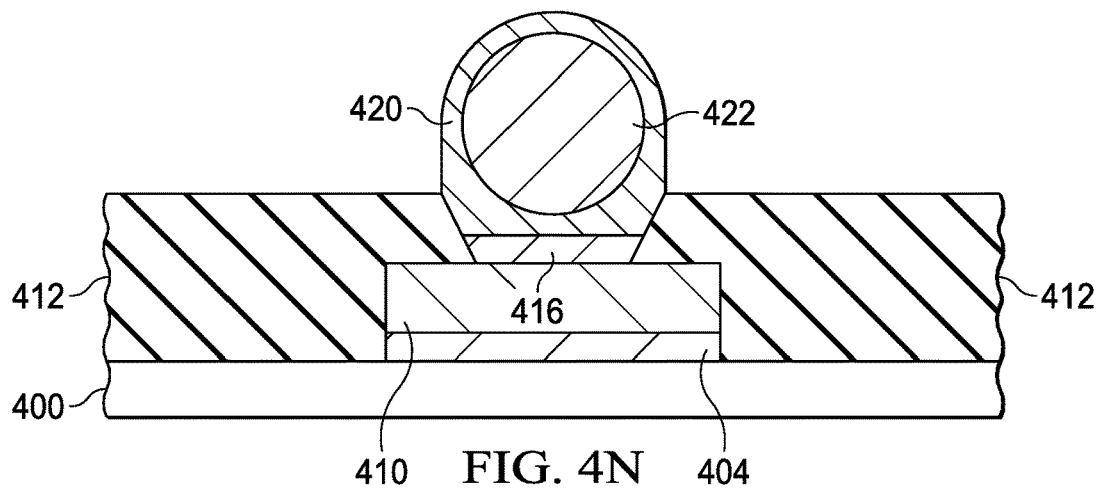

The method 300 then comprises reflowing the conductive member 326, as FIG. 4M depicts with the reflowing of the outer layer 420 of the conductive member 418. The method 300 additionally comprises washing away the flux adhesive material from the polyimide layer 328, as FIG. 4N depicts with the removal of the portion of the flux adhesive material 416 that is not positioned under the conductive member 418. The portion of the flux adhesive material 416 that is positioned under the conductive member 418 remains under the conductive member 418. FIG. 4N depicts the flux adhesive material 416 positioned under the conductive member 418, but the placement and reflowing of the conductive member 418 may alter the shape, overall size, thickness, and position of the portion of the flux adhesive material 416 under the conductive member 418. Nevertheless, the flux adhesive material 416 is still present under the conductive member 418.

Figure 4O:
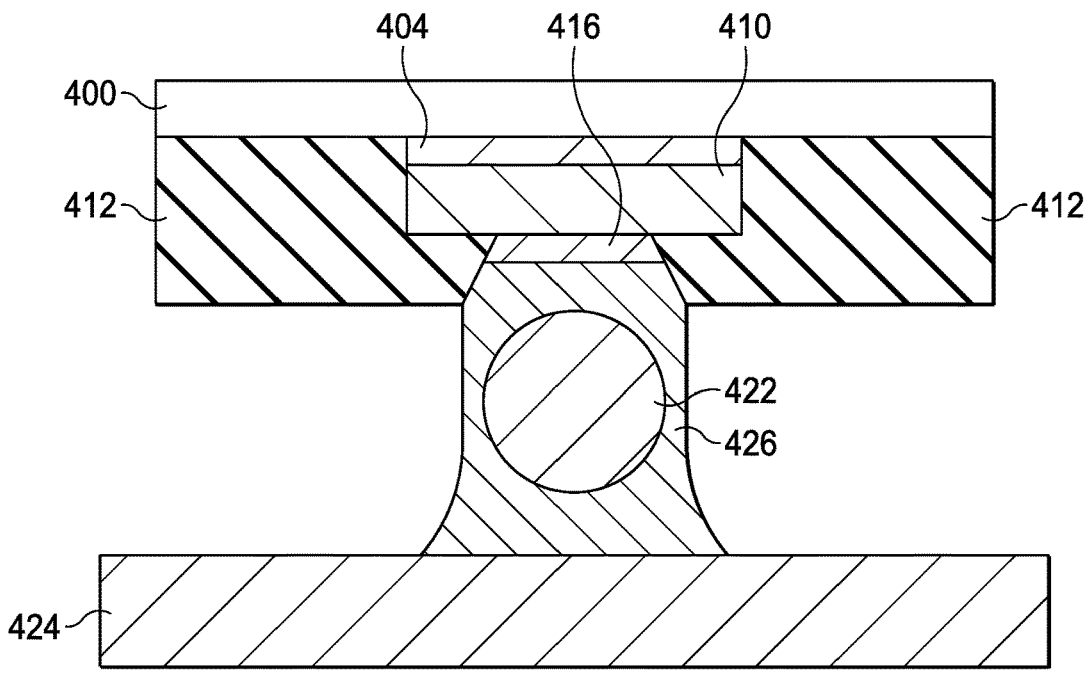
Figure 4P:
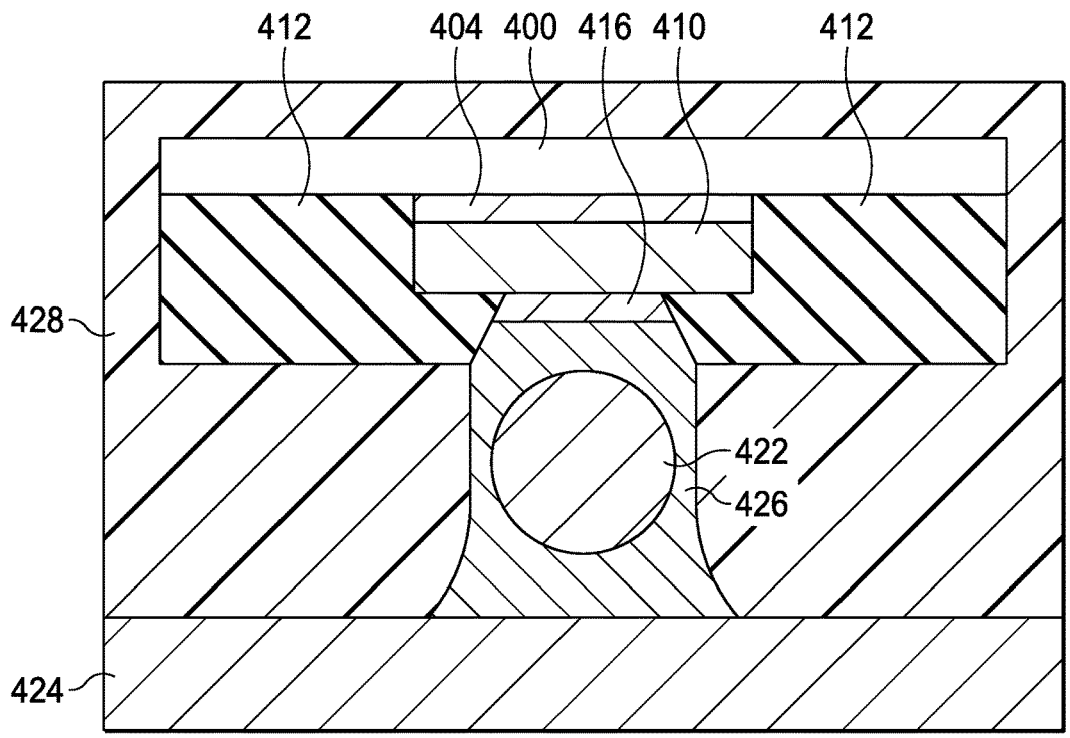
Figure 4Q:
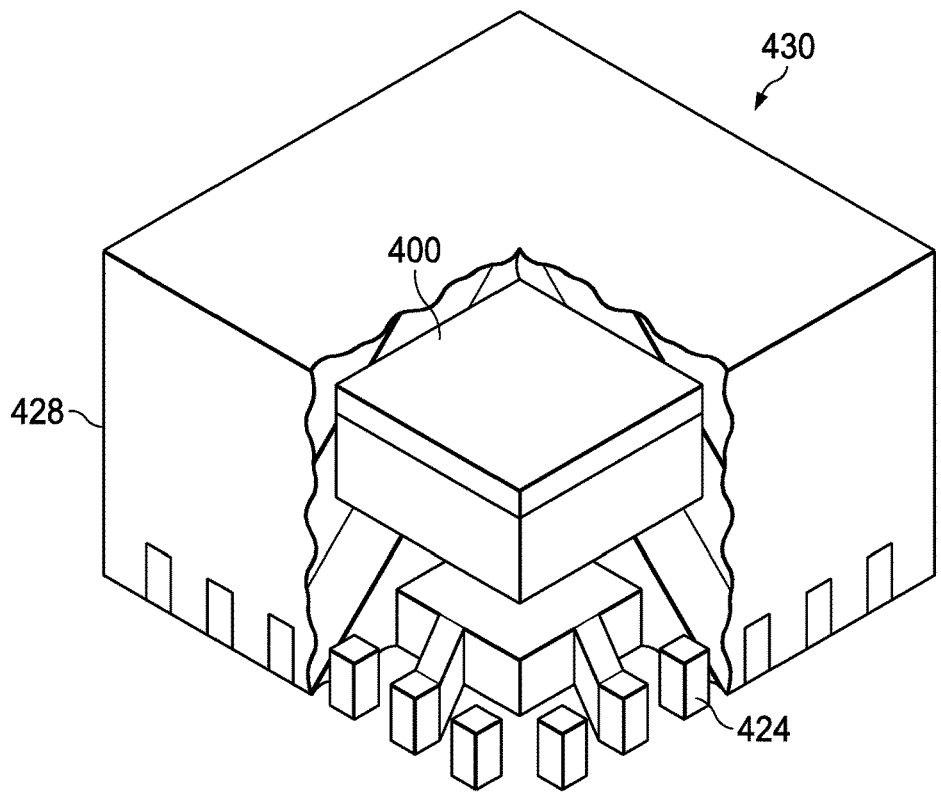

The method 300 then comprises backgrinding the wafer 330 and singulating the wafer to produce a die 332 that includes the structures shown in FIG. 4N. The method 300 comprises performing a flip-chip die attach 334 to one or more conductive terminals. FIG. 4O depicts step 334 of FIG. 3, with the reflowable, conductive outer layer 420 having been reflowed to perform the die attach to a conductive terminal 424, thereby producing a conductive layer 426 (e.g., a solder layer). The conductive core 422, which in some examples is a conductive sphere, is positioned within the conductive layer 426. The method 300 comprises applying a molding to the illustrative structure of FIG. 4O 336, thereby producing the structure of FIG. 4P, which includes a molding 428 (e.g., epoxy). In some examples, the conductive core 422 is physically isolated from the molding 428 (e.g., by the conductive layer 426, which abuts the molding 428). FIG. 4Q depicts a three-dimensional cutaway view of a flip-chip QFN package 430 comprising the molding 428 covering the conductive terminal 424, a portion of the semiconductor wafer 400, and the remaining structures depicted in FIG. 4P.

Figure 5A:
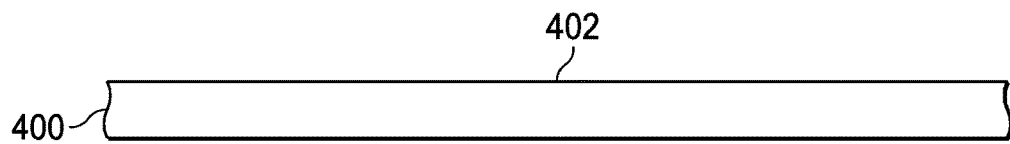
FIGS. 5A-5P depict a process flow for manufacturing a flip-chip QFN package in accordance with various examples.
Figure 5B:
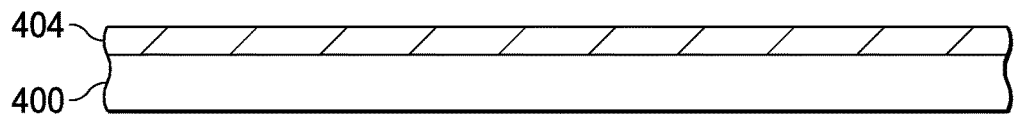
Figure 5C:
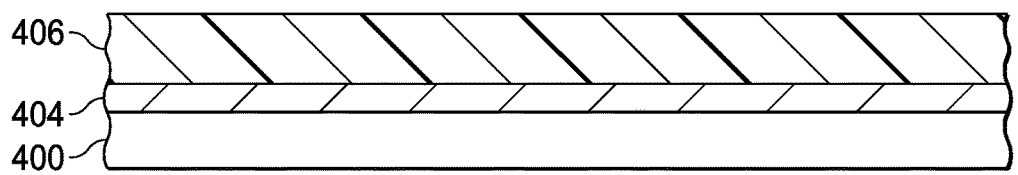
Figure 5D:
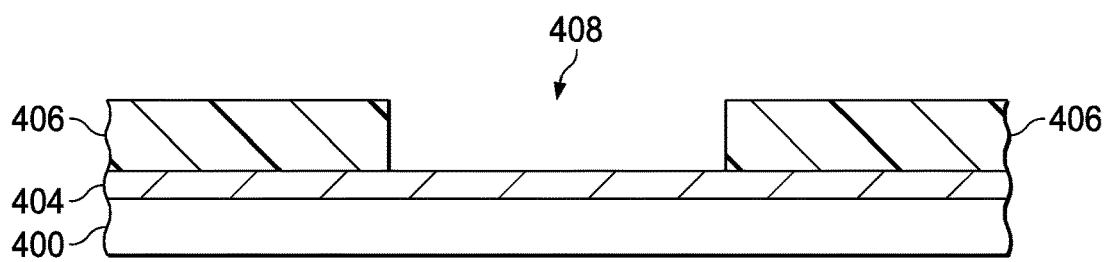
Figure 5E:
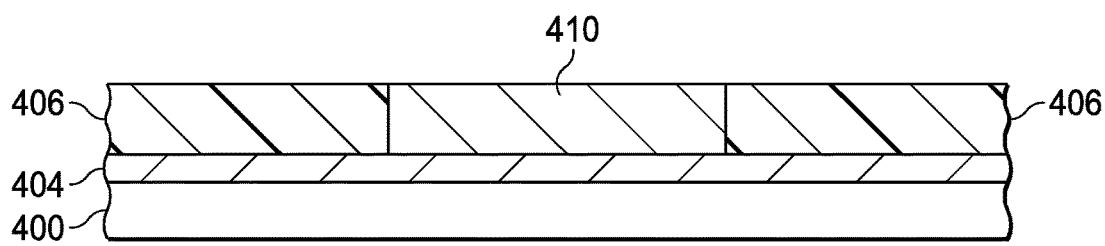
Figure 5F:
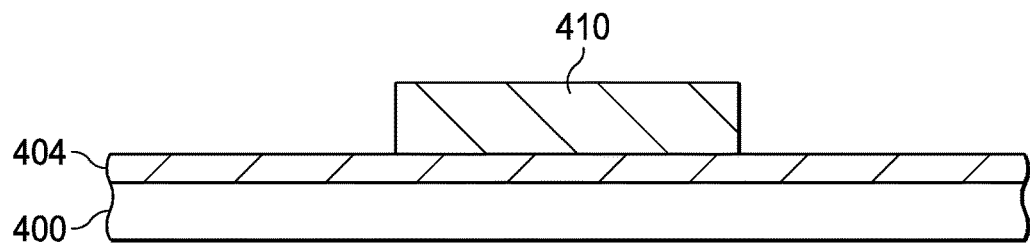
Figure 5G:
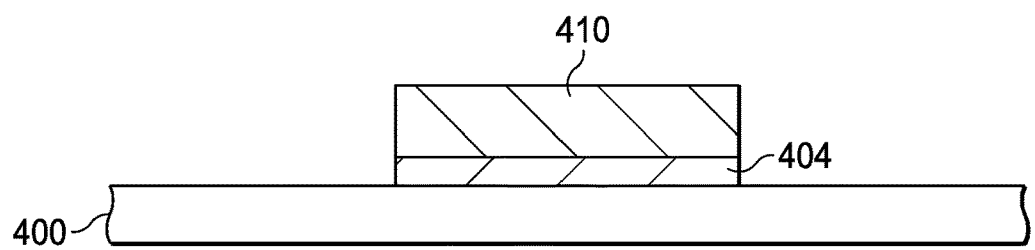
Figure 5H:
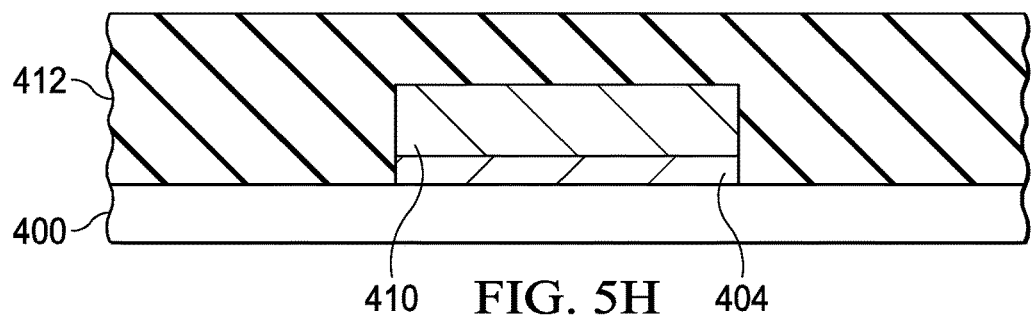
Figure 5I:
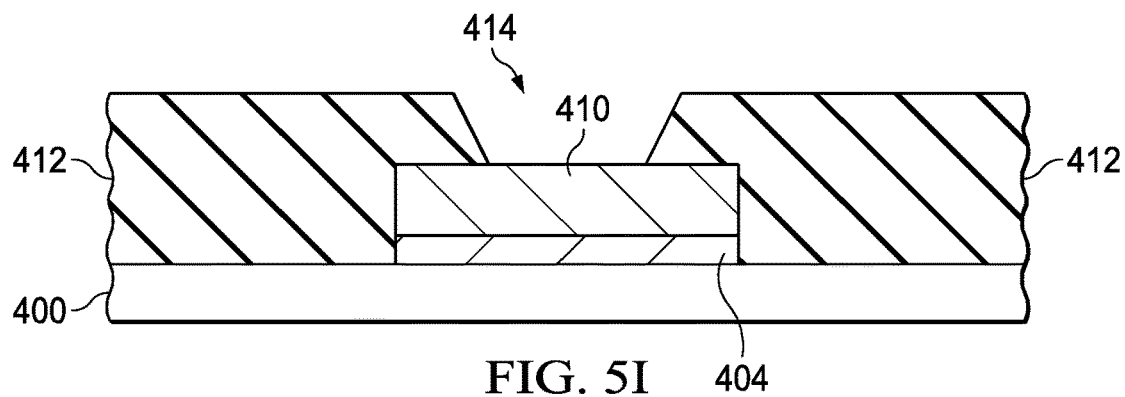
Figure 5J:
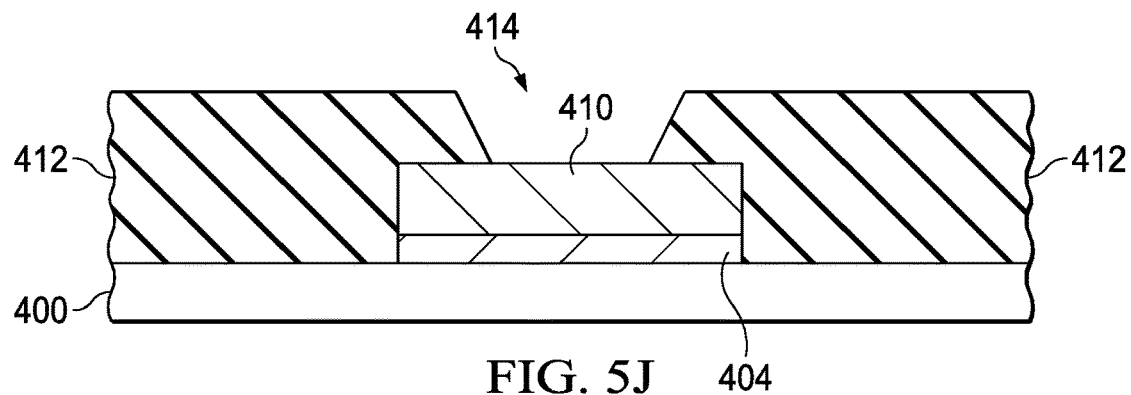
Figure 5K:
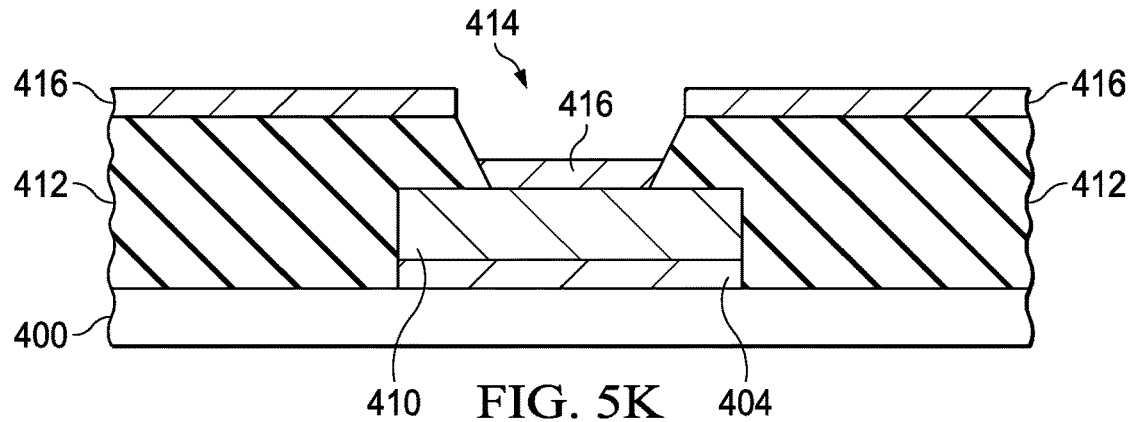
Figure 5L:
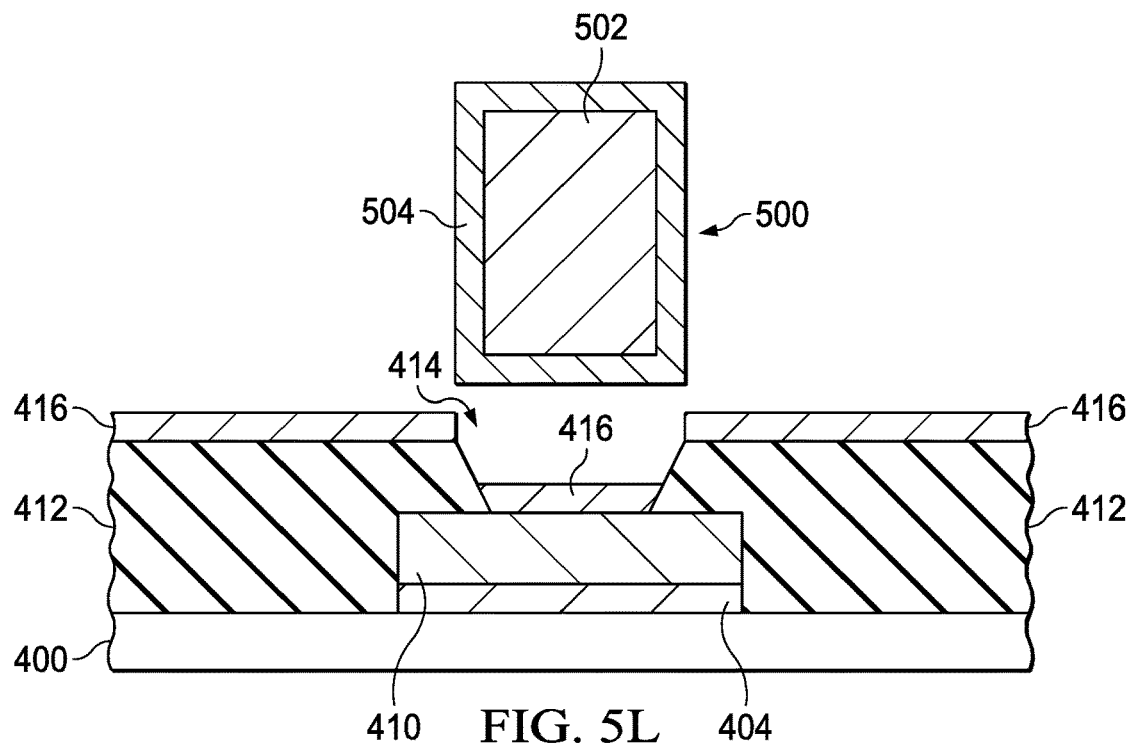
Figure 5M:
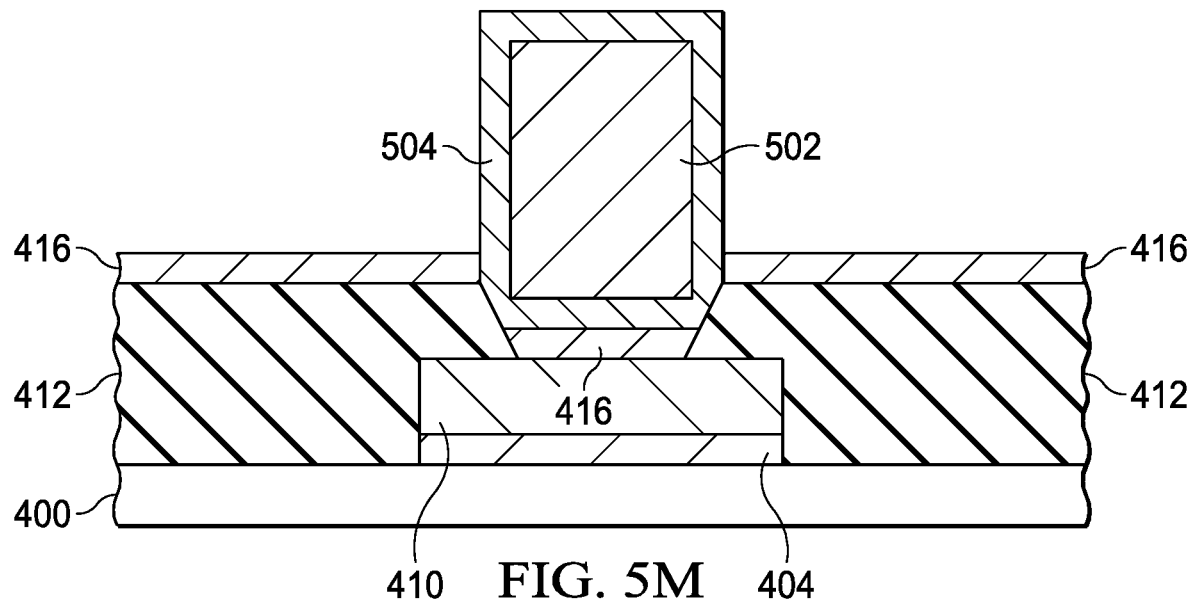
Figure 5N:
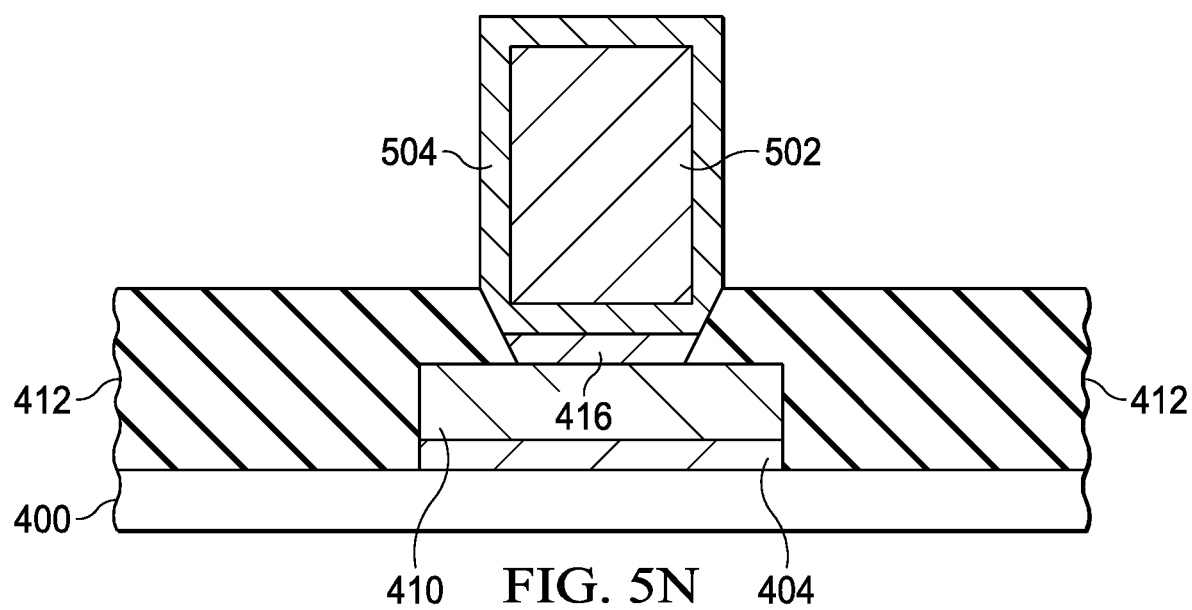
Figure 5O:
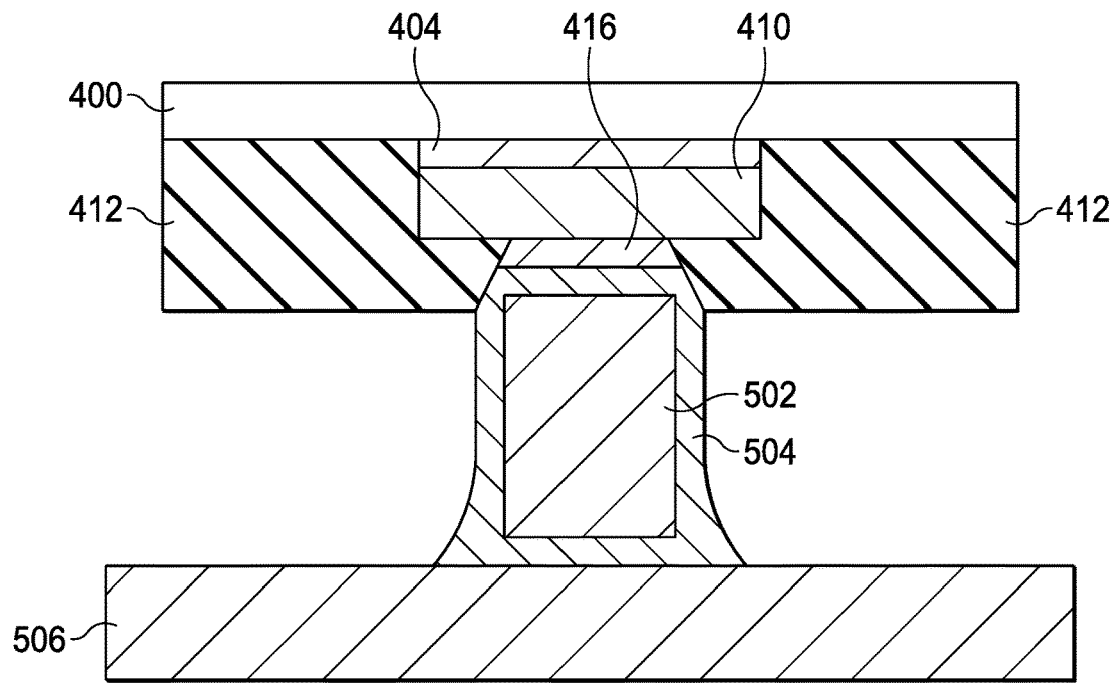
Figure 5P:
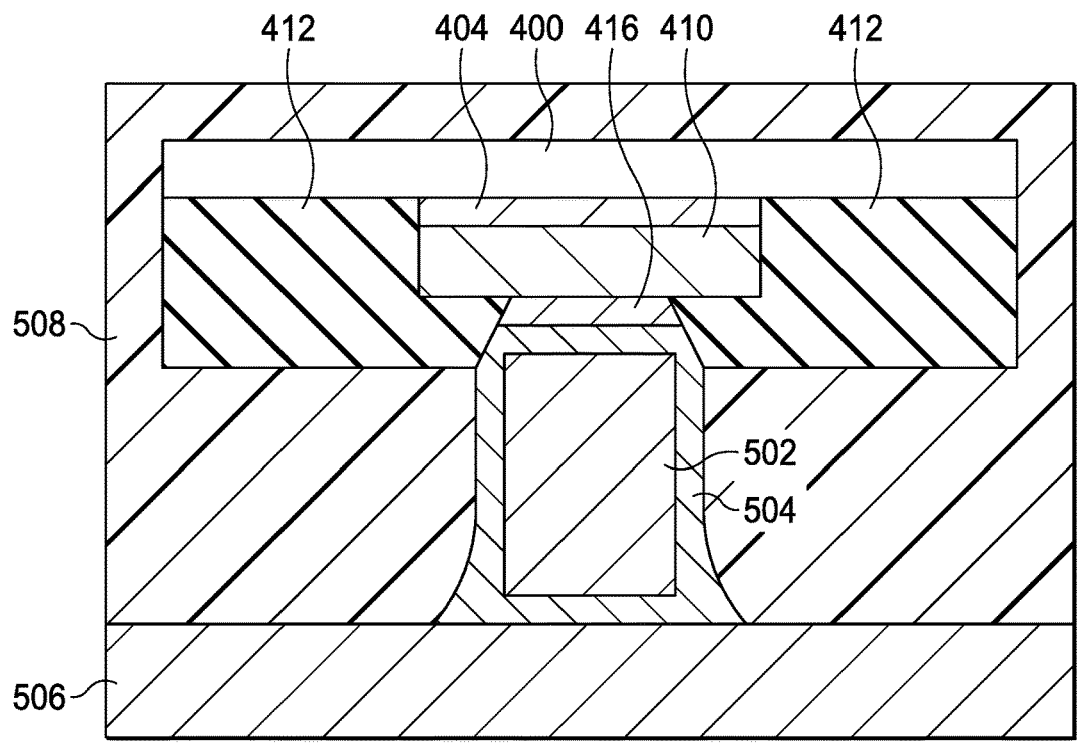

The steps of the method 300 may also be used to manufacture another type of flip-chip QFN package in accordance with various examples. Specifically, FIGS. 5A-5P depict a process flow for manufacturing a flip-chip QFN package that includes a rectangular conductive member 500 instead of a spherical conductive member 418 (e.g., as in FIG. 4L). The process flow of FIGS. 5A-5K is identical to that of FIGS. 4A-4K and is thus not repeated here for brevity. The process flow of FIGS. 5L-5P is also identical to that of FIGS. 4L-4P with the exception that the conductive member 500 includes a conductive core 502 that is a rectangular prism and a reflowable, outer layer 504 that is also a rectangular prism abutting the conductive core 502. The sizes and precise shapes of the conductive core 502 and the outer layer 504 may be chosen as desired. In other examples, other shapes besides rectangular prisms and spheres may be used. The three-dimensional cutaway view of FIG. 4Q is similar to and indicative of the package that is produced by the process flow of FIGS. 5A-5P.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct electrical or mechanical connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. All components or layers that are described or depicted in the drawings as abutting another component or layer couples to that component or layer. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A semiconductor package, comprising:
    a semiconductor die having a first surface;
    a conductive layer coupled to the first surface;
    a polyimide layer coupled to the conductive layer, wherein a second surface of the polyimide layer extends farther away from the first surface of the semiconductor die than does the conductive layer, and wherein the polyimide layer includes an orifice with a sloped sidewall extended from the second surface of the polyimide layer to the conductive layer;
    a solder layer coupled to the conductive layer and the polyimide layer;
    a conductive sphere coupled to the solder layer; and
    a conductive terminal coupled to the solder layer and exposed to a surface of the semiconductor package, the first surface of the semiconductor die facing the conductive terminal, wherein the solder layer includes:
        a first portion extending from the second surface of the polyimide layer toward the conductive terminal, wherein the first portion has a first circumference;
        a second portion connecting the first portion to the conductive terminal, wherein the second portion has successively increasing circumferences that are each greater than the first circumference; and
        a third portion connected to the first portion and extended to a flux adhesive material disposed within the orifice, the flux adhesive material connecting the third portion to the conductive layer, wherein the third portion has successively decreasing circumferences that are each less than the first circumference.

2. The semiconductor package of claim 1, wherein the conductive sphere has a diameter of 60 microns or less.

3. The semiconductor package of claim 1, wherein the conductive sphere comprises copper.

4. The semiconductor package of claim 1, further comprising a package molding abutting the solder layer, the conductive sphere physically isolated from the package molding.

5. The semiconductor package of claim 1, wherein the solder layer has a volume that is approximately equivalent to that of a sphere having a diameter ranging between 60 and 80 microns less a volume of the conductive sphere.

6. The semiconductor package of claim 1, wherein the orifice has a first area with a first width on the second surface of the polyimide layer and a second area with a second width on the conductive layer, the second width being less than the first width.

7. The semiconductor package of claim 6, wherein the conductive sphere has a diameter less than the first width and greater than the second width.

8. The semiconductor package of claim 6, wherein the first area of the orifice is within a footprint of the conductive layer.

9. The semiconductor package of claim 6, wherein the flux adhesive material is disposed on the second area.

10. The semiconductor package of claim 9, wherein the flux adhesive material covers a portion of the sloped sidewall adjacent to the conductive layer, and wherein the rest of the sloped sidewall directly abuts the third portion of the solder layer.

11. A semiconductor package, comprising:
a semiconductor die including a first surface with circuitry;
a conductive structure at the first surface, the conductive structure coupled to the circuitry;
a polyimide layer coupled to the conductive structure and to the first surface, wherein a second surface of the polyimide layer extends farther away from the first surface of the semiconductor die than does the conductive structure, and wherein the polyimide layer includes an opening with a sloped sidewall extended from the second surface to the conductive structure;
a solder structure coupled to the conductive structure;
a conductive sphere disposed within the solder structure; and
a conductive terminal of the semiconductor package coupled to the solder structure, wherein
the solder structure includes:
a first portion extending from the second surface of the polyimide layer toward the conductive terminal, wherein the first portion has a first circumference; and
a second portion connecting the first portion to the conductive terminal, wherein the second portion has successively increasing circumferences that are each greater than the first circumference; and
a third portion connected to the first portion and extended to a flux adhesive material disposed within the opening, the flux adhesive material located between the third portion and the conductive structure, wherein the third portion has successively decreasing circumferences that are each less than the first circumference.

12. The semiconductor package of claim 11, wherein the first surface of the semiconductor die faces toward the conductive terminal.

13. The semiconductor package of claim 11, further comprising a seed layer between the conductive structure and the first surface of the semiconductor die.

14. The semiconductor package of claim 13, wherein the seed layer comprises copper or tin-tungsten alloy.

15. The semiconductor package of claim 13, wherein the conductive structure and the seed layer share a same perimeter.

16. The semiconductor package of claim 13, wherein the conductive structure is coupled to the circuitry through the seed layer.

17. The semiconductor package of claim 11, wherein the opening has a first area with a first width on the second surface of the polyimide layer and a second area with a second width on the conductive structure, the second width being less than the first width.

18. The semiconductor package of claim 17, wherein the conductive sphere has a diameter less than the first width and greater than the second width.

19. The semiconductor package of claim 17, wherein the first area of the opening is within a footprint of the conductive structure.

20. The semiconductor package of claim 17, wherein the flux adhesive material is disposed on the second area.

21. The semiconductor package of claim 20, wherein the flux adhesive material covers a portion of the sloped sidewall adjacent to the conductive structure, and wherein the rest of the sloped sidewall directly contacts the third portion of the solder structure.

22. The semiconductor package of claim 11, wherein the solder structure has a first width at the second surface of the polyimide layer and a second width at the conductive terminal, the first width being less than the second width.

23. A semiconductor package, comprising:
a semiconductor die including circuitry;
a conductive structure on the semiconductor die, the conductive structure coupled to the circuitry;
a polyimide layer coupled to the conductive structure and to the semiconductor die, wherein the polyimide layer includes an opening extended to the conductive structure;
a solder structure coupled to the conductive structure;
a conductive sphere disposed within the solder structure; and
a conductive terminal of the semiconductor package coupled to the solder structure, wherein the solder structure includes:
a first portion extended from a surface of the polyimide layer toward the conductive terminal, the first portion having a first circumference; and
a second portion connected to the first portion and extended to the conductive terminal, the second portion having successively increasing circumferences that are each greater than the first circumference; and
a third portion connected to the first portion and extended toward the conductive structure, the third portion having successively decreasing circumferences that are each less than the first circumference.

24. The semiconductor package of claim 23, wherein the surface of the polyimide layer extends farther away from the semiconductor die than does the conductive structure.

25. The semiconductor package of claim 23, wherein a portion of the conductive terminal is exposed to a surface of the semiconductor package.

26. The semiconductor package of claim 23, further comprising:
a seed layer disposed between the semiconductor die and the conductive structure.

27. The semiconductor package of claim 26, wherein the seed layer comprises copper or tin-tungsten alloy.

28. The semiconductor package of claim 23, further comprising:
an adhesive material disposed within the opening, the adhesive material connecting the third portion to the conductive structure.

29. The semiconductor package of claim 23, wherein the conductive sphere comprises copper.

30. The semiconductor package of claim 23, further comprising:
a molding material abutting the solder structure, the conductive sphere isolated from the molding material.

31. The semiconductor package of claim 23, wherein the opening has a sloped sidewall.

32. The semiconductor package of claim 23, wherein the opening has a first area with a first width on the surface of the polyimide layer and a second area with a second width on the conductive structure, the second width being less than the first width.

33. The semiconductor package of claim 32, wherein the conductive sphere has a diameter less than the first width and greater than the second width.

\* \* \* \* \*